United States Patent
Nishi et al.

(10) Patent No.: US 8,093,902 B2
(45) Date of Patent: Jan. 10, 2012

(54) DEVICE ESTIMATING A STATE OF A SECONDARY BATTERY

(75) Inventors: Yuji Nishi, Nagoya (JP); Takeshi Takemoto, Nagoya (JP); Nobuyasu Haga, Seto (JP); Tetsuya Fuchimoto, Nagoya (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 465 days.

(21) Appl. No.: 12/447,715

(22) PCT Filed: Mar. 7, 2008

(86) PCT No.: PCT/JP2008/054693
§ 371 (c)(1),
(2), (4) Date: Apr. 29, 2009

(87) PCT Pub. No.: WO2008/126631
PCT Pub. Date: Oct. 23, 2008

(65) Prior Publication Data
US 2010/0085057 A1  Apr. 8, 2010

(30) Foreign Application Priority Data
Mar. 23, 2007 (JP) .................... 2007-077598

(51) Int. Cl.
*G01N 27/416* (2006.01)
*H02J 7/00* (2006.01)
(52) U.S. Cl. ........ 324/427; 324/426; 324/431; 324/433; 320/132; 320/134; 320/136
(58) Field of Classification Search .................. 324/427
See application file for complete search history.

(56) References Cited

U.S. PATENT DOCUMENTS

| 4,623,597 | A  | * | 11/1986 | Sapru et al. ................. 429/101 |
| 6,045,941 | A  | * | 4/2000  | Milewits ..................... 429/91 |
| 7,078,907 | B2 | * | 7/2006  | Uesaka et al. ............... 324/429 |
| 7,091,698 | B2 | * | 8/2006  | Yamazaki et al. ............ 320/132 |

FOREIGN PATENT DOCUMENTS

| JP | 11-204149 A   | 7/1999 |
| JP | 2004-178848 A | 6/2004 |
| JP | 2005-037230 A | 2/2005 |

* cited by examiner

OTHER PUBLICATIONS

W. B. Gu and C.Y. Wang: *Thermal-Electrochemical Coupled Modeling of a Lithium-Ion Cell*, ECS Proceedings, 2000, vol. 99-25 (1), U.S.A. Thomas F. Fuller, et al.: *Simulation and Optimization of the Dual Lithium Ion Insertion Cell*, J. Electrochem. Soc., vol. 141, No. 1, pp. 1-10, Jan. 1994.

*Primary Examiner* — Edward Tso
*Assistant Examiner* — Johali Torres Ruiz
(74) *Attorney, Agent, or Firm* — Kenyon & Kenyon LLP

(57) ABSTRACT

A diffusion estimation unit follows a diffusion equation in an active material that is represented by a polar coordinate to estimate a distribution in concentration of lithium in the active material. An open circuit voltage estimation unit obtains an open circuit voltage in accordance with a local SOC(θ) based on a concentration of lithium obtained at an interface of the active material as estimated by the diffusion estimation unit. A current estimation unit uses a battery's voltage measured by a voltage sensor, the estimated open circuit voltage, and a parameter value that is set for the battery by a battery parameter value setting unit, and follows a voltage-current relationship model expression simplified from an electrochemical reaction expression to estimate the battery's current density. A boundary condition setting unit sequentially sets a boundary condition for the diffusion equation of the diffusion estimation unit for the active material's interface, as based on the battery's estimated current density. Thus a battery model that allows an internal state to be estimated based on an electrochemical reaction dynamically and can also achieve an alleviated operating load can be used to estimate a state of a secondary battery.

14 Claims, 13 Drawing Sheets

FIG.3

| | DEFINITIONS OF SUPERSCRIBED/SUBSCRIBED LETTERS |
|---|---|
| | e: ELECTROLYTIC SOLUTION    j = 1: POSITIVE ELECTRODE |
| | s: ACTIVE MATERIAL    j = 2: NEGATIVE ELECTRODE |

| Symbol | Definition |
|---|---|
| $c_{ej}$ | CONCENTRATION OF Li IN ELECTROLYTIC SOLUTION |
| $c_{sj}$ | CONCENTRATION OF Li IN ACTIVE MATERIAL |
| $c_{sj,max}$ | LITHIUM CONCENTRATION LIMIT |
| $c_{sej}$ | CONCENTRATION OF Li AT INTERFACE OF ACTIVE MATERIAL |
| $\phi_{ej}$ | POTENTIAL IN ELECTROLYTIC SOLUTION |
| $\phi_{sj}$ | POTENTIAL IN ACTIVE MATERIAL |
| $T$ | ABSOLUTE TEMPERATURE |
| $j_j^{Li}$ | AMOUNT OF Li GENERATED PER UNIT VOLUME & UNIT TIME (REACTION CURRENT DENSITY) $I = \int j_j^{Li} dv$ |
| $\alpha_{aj}$ | MIGRATION COEFFICIENT OF ELECTRODE REACTION $j_j^{Li}$ (OXIDIZING REACTION) |
| $\alpha_{cj}$ | MIGRATION COEFFICIENT OF ELECTRODE REACTION $j_j^{Li}$ (REDUCTIVE REACTION) $a_{aj} + a_{cj} = 1$ |
| $F$ | FARADAY CONSTANT |
| $i_{oj}$ | EXCHANGE CURRENT DENSITY |
| $\eta_j$ | OVERVOLTAGE OF ELECTRODE REACTION $j_j^{Li}$ |
| $U_j$ | OCP (OPEN CIRCUIT POTENTIAL) |
| $\theta_j$ | LOCAL SOC AT INTERFACE OF ACTIVE MATERIAL $\theta_j = \dfrac{c_{sej}}{c_{sj,max}}$ |
| $R_f$ | RESISTANCE OF FILM OF SURFACE OF ELECTRODE |
| $t_+^0$ | TRANSPORT NUMBER OF Li ION |
| $D_{sj}$ | ACTIVE MATERIAL'S DIFFUSION COEFFICIENT |
| $D_{ej}^{eff}$ | ELECTROLYTIC SOLUTION'S EFFECTIVE DIFFUSION COEFFICIENT |
| $a_{sj}$ | ACTIVE MATERIAL'S SURFACE AREA PER ELECTRODE'S UNIT VOLUME |
| $r_{sj}$ | RADIUS OF ACTIVE MATERIAL |
| $\varepsilon_{sj}$ | VOLUME FRACTION (ACTIVE MATERIAL) $\varepsilon_s + \varepsilon_e + \varepsilon_p + \varepsilon_f = 1$ |
| $\varepsilon_{ej}$ | VOLUME FRACTION (ELECTROLYTIC SOLUTION) |
| $K_j^{eff}$ | ELECTROLYTIC SOLUTION'S EFFECTIVE ION CONDUCTIVITY |
| $K_{Dj}^{eeff}$ | ELECTROLYTIC SOLUTION'S DIFFUSION CONDUCTIVITY |
| $\sigma_j^{eff}$ | ACTIVE MATERIAL'S EFFECTIVE CONDUCTIVITY |
| $I$ | DENSITY OF CURRENT (PER UNIT SURFACE AREA OF ELECTRODE PLATE) |
| $L_j$ | THICKNESS OF ELECTRODE |

DIVIDED BY N
(ALSO DIVIDABLE AT UNEQUAL INTERVALS)

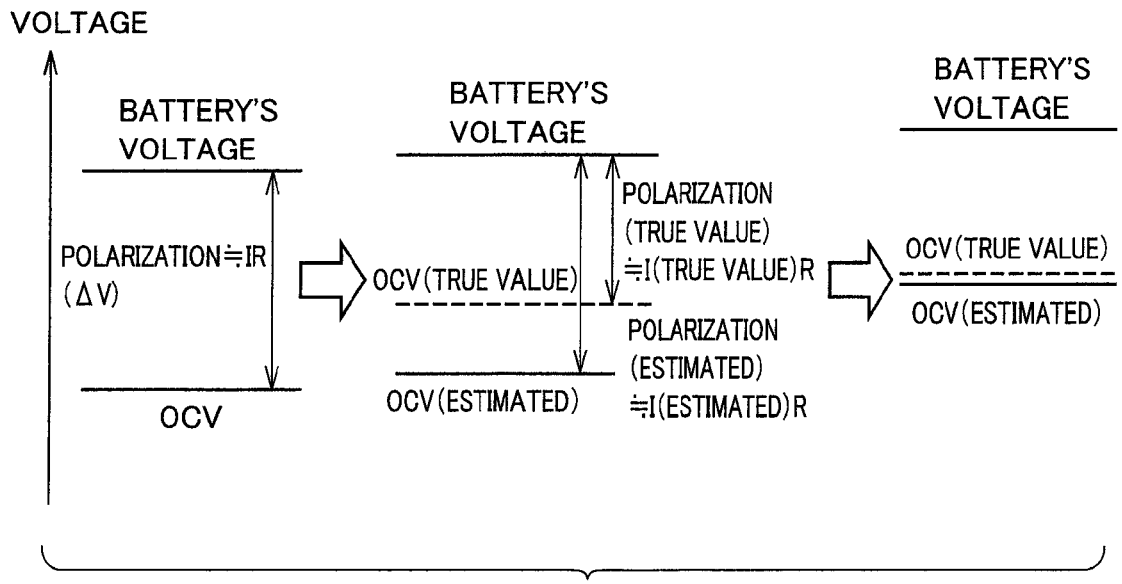
FIG.13
FIG.14
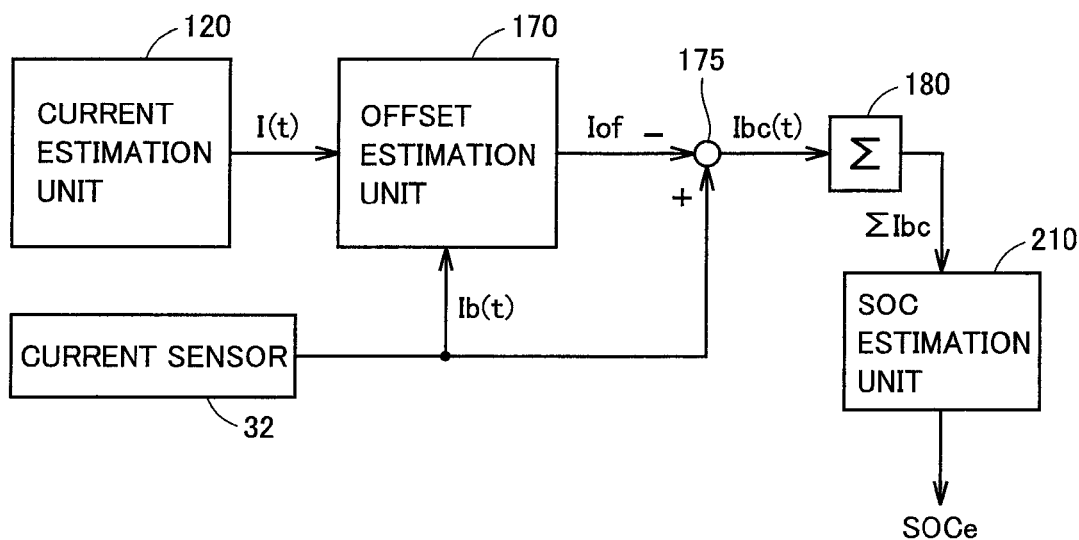

SENSOR MEASURED VALUE   MODEL ESTIMATED VALUE

OFFSET ERROR OF CURRENT SENSOR   SENSOR MEASURED VALUE

MODEL ESTIMATED VALUE

DEVICE ESTIMATING A STATE OF A SECONDARY BATTERY

This is a 371 national phase application of PCT/JP2008/054693 filed 7 Mar. 2008, claiming priority to Japanese Patent Application No. 2007-077598 filed 23 Mar. 2007, the contents of which are incorporated herein by reference.

TECHNICAL FIELD

The present invention relates generally to devices estimating a state of a secondary battery and in particular to devices estimating a state of a secondary battery in accordance with a battery model allowing the secondary battery's internal state to be estimated based on an electrochemical reaction.

BACKGROUND ART

There has been used a power supply system configured such that a chargeable secondary battery supplies a load with electric power and the secondary battery can also be charged as required while the load is in operation. Representatively, hybrid vehicles, electric vehicles and the like including as a driving force source an electric motor driven by a secondary battery have such power supply systems mounted therein. In these power supply systems, the secondary battery's stored electric power is used as electric power driving the electric motor serving as the driving force source, and electric power generated when the electric motor regenerates electric power, electric power generated by an electric power generator as an engine rotates, and the like charge the secondary battery. Typically, such power supply systems require a device estimating the secondary battery's state to precisely obtain a state of charge (SOC) relative to its fully charged state.

For hybrid vehicles in particular, it is necessary that the secondary battery have its state of charge controlled to be approximately intermediate between its fully charged state (100%) and its completely uncharged state (0%), i.e., 50 to 60%, so that the secondary battery can receive regenerated electric power and also supply the electric motor with electric power immediately as required.

Furthermore, over-discharging or overcharging a secondary battery may degrade the battery's performance and reduce its life. As such, when an intermediate SOC is set as a target for control, as described above, and a secondary battery is accordingly charged/discharged repeatedly in its use, the secondary battery's amount of charge is monitored sequentially and charging/discharging the secondary battery is controlled to restrict overcharging/over-discharging the secondary battery. In this regard also, it is significantly necessary to precisely estimate the secondary battery's state.

When a secondary battery's state is estimated, representatively, its state of charge is estimated. For example, patent document 1 (Japanese Patent Laying-open No. 2005-37230) discloses a technique to estimate from a value of a cumulative current of a battery how the battery varies in SOC. In particular, patent document 1 describes that a current sensor measures the battery's current and in parallel therewith an operation is performed to obtain an estimated charged/discharged current, and an operation is performed to obtain the battery's current to obtain a measured SOC, while the estimated charged/discharged current is accumulated to obtain an estimated SOC. A difference between the estimated SOC and the measured SOC is obtained and how the difference in SOC varies with time is accumulated to obtain a cumulative SOC value, and when the cumulative SOC value is equal to or larger than a predetermined value in comparison with an initial value, that the battery is degraded is detected.

In patent document 1, however, the estimated charged/discharged current is obtained in accordance with a relational expression based on Ohm's law between internal resistance, the battery's voltage and the battery's input. It is thus difficult to precisely estimate the battery's internal state from an electrochemical reaction.

Furthermore, patent document 2 (Japanese Patent Laying-open No. 2004-178848) discloses a device estimating a state of charge of a secondary battery, that is configured such that an adaptive digital filter is used to estimate no load voltage (OCV) from a value of the secondary battery's current as measured and that of a terminal's voltage as measured and a state of charge is estimated in accordance with a previously obtained relationship between no load voltage and a state of charge.

This device estimating a state of charge of a secondary battery, however, employs a low pass filter as the secondary battery's internal equivalent circuit model, and it is thus difficult to precisely estimate the secondary battery's internal behavior involving the diffusion of a reaction involved material contributing to an electrochemical reaction.

Accordingly, non-patent document 1 (W. B. Gu and C. Y. Wang, THERMAL-ELECTROCHEMICAL COUPLED MODELING OF A LITHIUM-ION CELL, ECS Proceedings Vol. 99-25 (1), 2000, ECS, pp. 748-762) discusses a battery model employing an expression of an electrochemical reaction internal to a lithium battery and reports that a characteristic can be represented with high precision in comparison with an actual battery. In particular, non-patent document 1 indicates that the secondary battery's no load voltage depends on a local SOC obtained at an electrode's interface with an electrolytic solution (a surface of an active material) and as a result the battery's voltage in relaxation is governed by diffusion of lithium depending on how lithium is distributed in concentration in an active material. In particular, the document discloses that the diffusion of the reaction involved material (lithium) in the active material is governed by a diffusion equation of spherical coordinates handling the active material as a sphere and a diffusion rate of a material governed by a diffusion coefficient in a diffusion process.

In estimating a secondary battery's state, as indicated in patent documents 1 and 2, as described above, the secondary battery's internal state will estimated by a macro equivalent model with the secondary battery's voltage and current serving as an input and an output, and it is difficult to provide estimation with high precision based on the secondary battery's internal state involving the reaction involved material's diffusion.

On the other hand, as disclosed in non-patent document 1, if the reaction involved material's diffusion is represented by a diffusion equation, as based on the battery's internal electrochemical reaction, and the battery's open circuit voltage depends on a local SOC obtained at an electrode-electrolytic solution interface (a surface of an active material), then while the battery model will be non-linear, the battery's state can be estimated with higher precision. However, an analysis provided in accordance with the model disclosed in non-patent document 1 involves a significantly large operating load and it is thus difficult for example to mount it in an actual device and estimate a state on line when the secondary battery is used.

DISCLOSURE OF THE INVENTION

The present invention has been made to overcome such disadvantage as described above, and it contemplates a device estimating a state of a secondary battery, that employs a battery model allowing the battery's internal state to be estimated from an electrochemical reaction and also achieving an alleviated operating load, and is thus suitable for being mounted in an actual device.

The present device estimating a state of a secondary battery is a device estimating a state of a secondary battery including first and second electrodes configured to include an active material containing a reactant material contributing to an electrochemical reaction and an ion conductor for conducting between the first and second electrodes the reactant material ionized. The device comprises a voltage detector, a diffusion estimation unit, an open circuit voltage estimation unit, a current estimation unit, and a boundary condition setting unit. The voltage detector detects a voltage of the battery between the first and second electrodes. The diffusion estimation unit estimates a distribution in concentration of the reactant material in accordance with an active material diffusion model expression defining the distribution in concentration of the reactant material in the active material, as based on a given boundary condition. The open circuit voltage estimation unit estimates an open circuit voltage between the first and second electrodes, as based on a concentration of the reactant material obtained at an interface of the active material with an electrolytic solution, as estimated by the diffusion estimation unit. The current estimation unit estimates a density of a current of the secondary battery in accordance with a voltage-current relationship model expression based on the electrochemical reaction and indicating a relationship between the open circuit voltage, an overvoltage calculated in accordance with the density of the current of the secondary battery, a voltage drop caused in accordance with the density of the current of the secondary battery, and the voltage of the battery. In particular, the current estimation unit calculates the density of the current of the secondary battery by substituting in the voltage-current relationship model expression the voltage of the battery detected by the voltage detector, the open circuit voltage estimated by the open circuit voltage estimation unit, and a parameter value of the secondary battery. The boundary condition setting unit calculates a reaction current density at the interface, as based on the density of the current of the battery estimated by the current estimation unit, and sets the boundary condition for the diffusion estimation model expression for the interface in accordance with the reaction current density calculated.

The above device estimating a state of a secondary battery can estimate how a reactant material (representatively, lithium in a lithium battery) is diffused in an active material in accordance with an active material diffusion model expression and combine the active material diffusion model expression with a simplified a voltage-current relationship model expression estimating the secondary battery's current density from an open circuit voltage (OCV, which is synonymous with no load voltage) estimated from a concentration of the reactant material estimated at an interface of the active material with the electrolytic solution, the battery's voltage as measured, and a parameter value previously obtained for the secondary battery to estimate how the reactant material is distributed in concentration. A battery model expression can thus be implemented that allows a simplified a voltage-current relationship model expression to alleviate an operating load and a secondary battery's internal state to be estimated from an electrochemical reaction with high precision.

Preferably, the device estimating a state of a secondary battery further comprises a temperature detector, and a parameter value setting unit for setting the parameter value variably in accordance with at least the temperature of the battery. The temperature detector detects the temperature of the secondary battery. The parameter value setting unit further sets a parameter value indicative of a diffusion rate in the active material diffusion model expression variably in accordance with at least the temperature of the battery.

Thus a parameter value used in a battery model expression can be set variably in accordance with the secondary battery's temperature. A battery parameter's temperature dependence can thus be reflected to further precisely estimate the secondary battery's state.

Still preferably, the voltage-current relationship model expression is configured by a linearly approximated expression indicating that the open circuit voltage minus a product of the density of the current of the battery and an electrical resistance provided per a unit area of the electrode that is served as the parameter value is a voltage equal to the voltage of the battery, and the parameter value setting unit sets the electrical resistance variably in accordance with the concentration of the reactant material obtained at the interface, as estimated by the diffusion estimation unit, and the temperature of the battery detected by the temperature detector.

The linearly approximated expression can eliminate the necessity of performing a convergent calculation in an operation of a voltage-current relationship model expression estimating a battery's current density from the battery's voltage. This can alleviate a load of and stabilize the operation by the voltage-current relationship model expression, and a battery model expression can be implemented that is suitable for being mounted in an actual device.

Furthermore, preferably, the device estimating a state of a secondary battery further comprises a current operation unit that separates the density of the current of the secondary battery in total into a first current density contributing to the electrochemical reaction and a second current density caused by a component caused in the secondary battery for an electric double layer capacitor. The boundary condition setting unit calculates the reaction current density at the interface, as based on the first current density calculated by the current operation unit, and in the voltage-current relationship model expression the overvoltage is calculated based on the first current density.

Thus, the secondary battery's entire current component can have separated therefrom a current that flows through an electric double layer capacitor and thus does not contribute to an electrochemical reaction, and the active material diffusion model expression and the voltage-current relationship model expression can thus be operated. Estimation with improved precision can be achieved.

Still preferably, the device estimating a state of a secondary battery further comprises: a temperature detector that detects a temperature of the secondary battery; and a parameter value setting unit for setting the parameter value variably in accordance with at least the temperature of the battery. The voltage-current relationship model expression is configured of: a linearly approximated expression indicating that a product of the first current density and a first electrical resistance provided per a unit area of the electrode that is served as the parameter value is equal to the voltage of the battery; and an expression indicating that the second current density that is served as the parameter value and flowing through the capacitor per the unit area of the electrode is a value proportional to an amount of the voltage of the battery that varies with time.

Furthermore, the parameter value setting unit sets the first electrical resistance variably in accordance with the concentration of the reactant material obtained at the interface, as estimated by the diffusion estimation unit, and the temperature of the battery detected by the temperature detector, and also variably sets a capacitance per the unit area of the electrode in accordance with the temperature of the battery.

The linearly approximated expression can eliminate the necessity of performing a convergent calculation in an operation of a voltage-current relationship model expression estimating a battery's current density from the battery's voltage. This can alleviate a load of and stabilize the operation by the voltage-current relationship model expression, and a battery model expression can be implemented that is suitable for being mounted in an actual device.

Preferably, the diffusion estimation unit has the active material diffusion model expression represented by a polar coordinate for each of the first and second electrodes.

Thus for the first and second electrodes separate active material diffusion models can be created, respectively, and for each electrode how a reactant material (e.g., lithium) diffuses can be modeled. Estimation can be done with improved precision.

Furthermore, preferably, the diffusion estimation unit has the active material diffusion model expression represented by a polar coordinate and shared by the first and second electrodes.

Thus the first and second electrodes can share a single active material diffusion model. A battery model expression can be implemented that contemplates a further alleviated operating load and is thus further suitable for being mounted in an actual device.

Alternatively, preferably, the voltage-current relationship model expression is derived as based on: a voltage equation indicating a relationship between average potentials of the active material and the electrolytic solution, an average value of an overvoltage generated as the electrochemical reaction is caused at the interface, and the open circuit voltage; and an electrochemical reaction expression indicating a relationship between the density of the current of the battery and the average value of the overvoltage.

Still preferably, assuming that the first and second electrodes each have the electrochemical reaction caused therein uniformly without site dependence, the voltage-current relationship model expression is derived by simplifying a distribution in potential of the active material in the electrode and the electrolytic solution to a quadric, and in that condition, obtaining the average potentials of the active material and the electrolytic solution.

Thus the voltage-current relationship model expression is derived as based on: a voltage equation indicating a relationship between average potentials of the active material and the electrolytic solution, an overvoltage generated as the electrochemical reaction is caused, and the open circuit voltage, and furthermore, an electrochemical reaction expression indicating a relationship between the density of the current of the battery and the average value of the overvoltage. This allows an electrochemical reaction model expression to be simplified without significantly impaired precision of estimation.

Preferably, the device estimating a state of a secondary battery further comprises an average concentration calculation unit and a first state-of-charge estimation unit. The average concentration calculation unit calculates an average concentration of the reactant material in the active material, as based on the distribution in concentration of the reactant material estimated by the diffusion estimation unit. The first state-of-charge estimation unit estimates a state of charge of the secondary battery in accordance with a previously obtained correspondence relationship between the average concentration and the state of charge, as based on the average concentration calculated by the average concentration calculation unit.

Thus the secondary battery's state of charge (SOC) can be estimated in accordance with an average concentration of the reactant material in the active material of the electrode. The state of charge can be estimated with high precision based on a state estimated from an electrochemical reaction caused in the secondary battery.

Still preferably, the device estimating a state of a secondary battery further comprises a current detector, a second state-of-charge estimation unit, and a third state-of-charge estimation unit. The current detector detects a current of the secondary battery. The second state-of-charge estimation unit estimates an amount of variation of the state of charge of the secondary battery, as based on the current of the battery accumulated. The third state-of-charge estimation unit sequentially updates an estimated value of the state of charge of the secondary battery, as based on a result of estimating by the first and second state-of-charge estimation units. Furthermore, the third state-of-charge estimation unit calculates a current value of the estimated value of the state of charge by reflecting the amount of variation of the state of charge from the previous value estimated by the second state-of-charge estimation unit, and an error in state of charge between a current state of charge estimated by the first state-of-charge estimation unit and the previous value, in a previous value of the estimated value of the state of charge, on the previous value. In particular, the amount of variation of the state of charge is reflected with a time constant relatively smaller than that applied in reflecting the error in state of charge.

Thus, estimating a state of charge based on a cumulative measured current value, which is highly precise for short-term estimation, and estimating a state of charge based on the above described battery model, can be combined together to estimate the secondary battery's state of charge with high precision.

Furthermore, still preferably, the device estimating a state of a secondary battery further comprises a current detector, a second state-of-charge estimation unit, and a third state-of-charge estimation unit. The current detector detects a current of the secondary battery. The second state-of-charge estimation unit estimates an amount of variation of the state of charge of the secondary battery, as based on the current of the battery accumulated. The third state-of-charge estimation unit sequentially updates an estimated value of the state of charge of the secondary battery, as based on a result of estimating by the first and second state-of-charge estimation units. Furthermore, the third state-of-charge estimation unit calculates a current value of the estimated value of the state of charge by reflecting the amount of variation of the state of charge from the previous value estimated by the second state-of-charge estimation unit, and an error in state of charge between a current state of charge estimated by the first state-of-charge estimation unit and a previous value of the estimated value of the state of charge, on the previous value. In particular, when the current of the battery has an absolute value larger than a predetermined value or the temperature of the secondary battery is lower than a predetermined temperature, the third state-of-charge estimation unit ceases to reflect the error in state of charge and calculates the current value of the estimated value of the state of charge.

Thus when estimating a state of charge from a cumulative measured current value and estimating a state of charge from the above described battery model are combined together, and a large current flows and/or low temperature is attained that reduce the battery model's estimation error, the battery model's estimation error can be prevented from contributing to a state of charge estimated with poor precision.

Still preferably, the device estimating a state of a secondary battery further comprises an offset estimation unit that calculates an estimated value of the current of the battery, as based on the density of the current of the battery estimated by the current estimation unit, and estimates an offset error of the current detector, as based on an error of the estimated value of the current of the battery and a value detected by the current detector. The second state-of-charge estimation unit uses the offset error estimated by the offset estimation unit to correct the value of the current of the battery detected by the current detector, and estimates the amount of variation of the state of charge of the secondary battery, as based on an accumulation of the value detected that is corrected.

Alternatively, preferably, the device estimating a state of a secondary battery further comprises a current detector, an offset estimation unit, and a state-of-charge estimation unit. The current detector detects a current of the secondary battery. The offset estimation unit calculates an estimated value of the current of the battery, as based on the density of the current of the battery estimated by the current estimation unit, and estimates an offset error of the current detector, as based on an error of the estimated value of the current of the battery and a value detected by the current detector. The state-of-charge estimation unit uses the offset error estimated by the offset estimation unit to correct the value of the current of the battery detected by the current detector, and estimates an amount of variation of the state of charge of the secondary battery, as based on an accumulation of the value detected that is corrected.

Thus the current detector's offset can be estimated from the battery's current estimated through a battery model and a measured current value with the offset corrected can be accumulated to allow a state of charge to be estimated from a cumulative current with improved precision.

Thus a major advantage of the present invention lies in being capable of implementing a device estimating a state of a secondary battery that employs a battery model that allows the secondary battery's internal state to be estimated from an electrochemical reaction and also achieves an alleviated operating load, and is thus suitable for being mounted in an actual device.

BRIEF DESCRIPTION OF THE DRAWINGS

FIG. 3 is a list of variables and constants employed in a battery model expression.

FIG. 13 conceptually illustrates self modification of an SOC estimation error by the device estimating a state of a secondary battery according to the first embodiment.

FIG. 14 is a block diagram for illustrating how a device estimating a state of a secondary battery estimates an SOC according to a second embodiment.

BEST MODES FOR CARRYING OUT THE INVENTION

Hereinafter reference will be made to the drawings to describe the present invention in embodiments. In the figures, identical or corresponding components are identically denoted and in principle will not be described repeatedly.

First Embodiment

Figure 1:
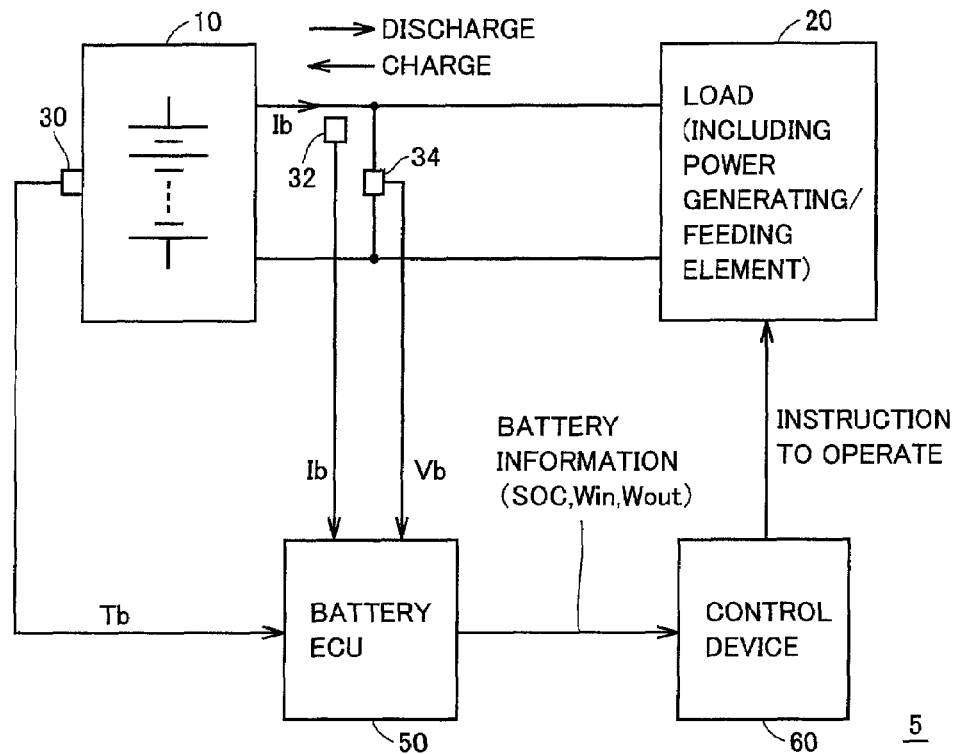
FIG. 1 is a block diagram schematically illustrating an exemplary configuration of a power supply system having applied thereto a device estimating a state of a secondary battery according to an embodiment of the present invention.

FIG. 1 is a block diagram schematically illustrating an exemplary configuration of a power supply system having applied thereto a device estimating a state of a secondary battery according to an embodiment of the present invention.

With reference to FIG. 1, a power supply system 5 is configured of a secondary battery 10, a load 20, and a battery ECU 50 and a control device 60 configured of an electronic control unit (ECU). Each ECU is representatively configured of a microcomputer and a memory (random access memory (RAM), read only memory (ROM), or the like) for performing a previously programmed predetermined sequence and predetermined operation.

Chargeable and dischargeable secondary battery 10 is representatively implemented as a lithium ion battery, which is suitable for application to the present invention as the battery has an output characteristic varying with how a reactant material (lithium) is distributed in the battery, in an active material of an electrode in particular, in concentration.

Secondary battery 10 is provided with a temperature sensor 30 measuring the battery's temperature Tb, a current sensor 32 measuring a current Ib input/output to/from secondary battery 10 (hereinafter also referred to as "the battery's current Ib"), and a voltage sensor 34 measuring an inter-terminal voltage Vb between a positive electrode and a negative electrode (hereinafter also referred to as "the battery's voltage Vb").

Load 20 is driven by electric power output from secondary battery 10. Furthermore, it is assumed that an electric power generating/feeding element (not shown) is provided to be included in load 20 or separately from load 20 and that secondary battery 10 is chargeable with a current charged from the electric power generating/feeding element. Accordingly, when secondary battery 10 is discharged, the battery's current is positive (i.e., >0), and when secondary battery 10 is charged, the battery's current is negative (i.e., <0).

Battery ECU 50 receives values detected by the group of sensors 30, 32, 34 provided for secondary battery 10 and, based thereon, follows a battery model allowing an internal state of secondary battery 10 to be estimated from an electrochemical reaction, as will be described hereinafter more specifically, to calculate an estimated state value indicative of the battery's state sequentially for each predetermined period.

Furthermore, from the estimated state value calculated, battery ECU 50 generates battery information for restricting charging/discharging the secondary battery. Representatively, the battery information includes an SOC (0% to 100%) indicating an charged amount (or available capacitance) relative to a fully charged state (100%), an electric power allowed to be input Win indicating an upper limit value for electric power currently permitted to be charged and an electric power allowed to be output Wout indicating an upper limit value for electric power discharged, and the like.

Control device 60 operates in response to a request to load 20 for operation and with the battery information received from battery ECU 50 taken into consideration to limit charging/discharging secondary battery 10 to avoid overcharging or over-discharging secondary battery 10, and in that condition generates an instruction to operate load 20. For example, control device 60 limits the electric power that is input/output to/from secondary battery 10 to be the electric power allowed to be input Win/the electric power allowed to be output Wout and generates the instruction to operate load 20. Furthermore, when secondary battery 10 has an SOC of at most a lower limit value, control device 60 prohibits load 20 from performing an operation consuming electric power or compulsorily initiates an operation of load 20 to generate electric power (or an operation to charge secondary battery 10). In contrast, when secondary battery 10 has an SOC of at least an upper limit value, control device 60 compulsorily prohibits load 20 from performing the operation generating electric power.

Configuration of Secondary Battery and Battery Model Thereof

Figure 2:
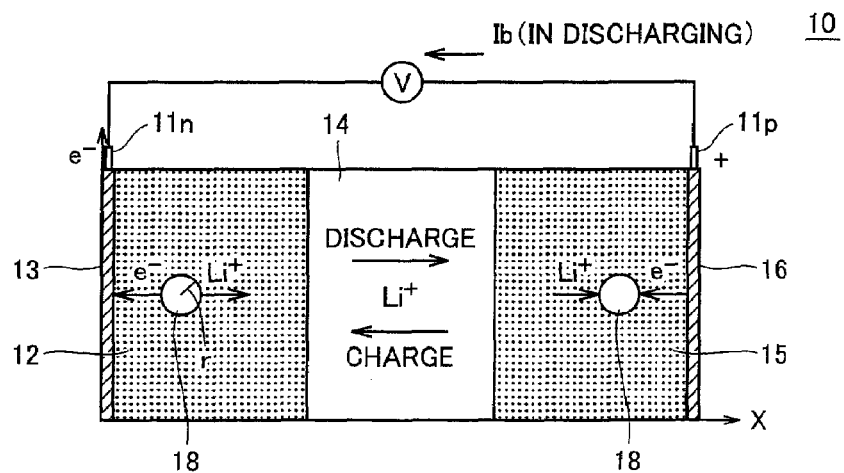
FIG. 2 schematically shows a configuration of a secondary battery.

FIG. 2 schematically shows a configuration of the secondary battery.

With reference to FIG. 2, secondary battery 10 includes a negative electrode 12, a separator 14, and a positive electrode 15. Separator 14 is configured of resin provided between negative electrode 12 and positive electrode 15 and having an electrolytic solution permeated therein. Separator 14 corresponds to an "ion conductor" in the present invention. Furthermore, a horizontal axial coordinate x indicates a position in the electrodes' depthwise direction.

Negative electrode 12 and positive electrode 15 are each configured of an aggregate of a spherical active material 18. In discharging, a chemical reaction is caused on an interface of active material 18 of negative electrode 12 to discharge lithium ion Li$^+$ and electron e$^-$ while on an interface of active material 18 of positive electrode 15 a chemical reaction is caused to absorb lithium ion Li$^+$ and electron e$^-$.

Negative electrode 12 is provided with a current collector 13 absorbing electron e$^-$ and positive electrode 15 is provided with a current collector 16 discharging electron e$^-$. Representatively, the negative electrode's current collector 13 is configured of copper and the positive electrode's current collector 16 is configured of aluminum. Current collector 13 is provided with a terminal 11n of the negative electrode and current collector 16 is provided with a terminal 11p of the positive electrode. By communicating lithium ion Li$^+$ through separator 14, secondary battery 10 is charged/discharged and a charging current Ib (>0) or a discharging current Ib (<0) is caused.

Initially will be described a battery model expression disclosed in non-patent document 1 that is applied to the battery model schematically shown in FIG. 2.

In accordance with the present invention in an embodiment a secondary battery charging device employs a basic battery model expression indicated by primitive equations of expressions (1) to (11) indicated below. Furthermore, FIG. 3 is a list of variables and constants used in the battery model expression.

Note that in the model expression described hereinafter some variables and constants are indicated with a superscripted/subscripted letter "e", which indicates that they are values for the electrolytic solution, and a subscripted letter "s", which indicates that they are values for the active material. In particular, a subscripted letter "j" distinguishes the positive electrode and the negative electrode, and it is assumed that j=1 indicates a value for the positive electrode and that j=2 indicates a value for the negative electrode. If variables or constants for the positive electrode and the negative electrode are collectively represented, they will be done so without the subscripted letter "j". Furthermore, a representation of (t) indicating a function of time, a representation of (T) indicating dependence on the battery's temperature, and a representation of (θ) indicating dependence on a local SOC θ, and the like may be omitted in the present specification. Furthermore, a symbol # added to a variable or a constant represents an average value.

$$\frac{j_j^{Li}(x, \theta_j, t)}{a_{sj}} = i_{0j}(x, \theta_j, T, t) \cdot \left[ \exp\left(\frac{\alpha_{aj} F}{RT} \cdot \eta_j\#(x, \theta_j, t)\right) - \exp\left(-\frac{\alpha_{cj} F}{RT} \cdot \eta_j\#(x, \theta_j, t)\right) \right] \quad (1)$$

$$\eta_j(x, \theta_j, t) = \phi_{sj}(x, t) - \phi_{ej}(x, t) - U_j(x, \theta_j, t) \quad (2)$$

The above expressions (1), (2) are expressions indicating an electrochemical reaction at an electrode (or the active material) and referred to as Butler-Volmer Equation.

Furthermore, an expression (3) is established as an expression relating to a principle of conservation in density of lithium ions in the electrolytic solution. On the other hand, a diffusion equation of expression (4) and a boundary condition expression indicated by expressions (5) and (6) are applied as expressions relating to a principle of conservation in concentration of lithium in the active material. An expression (5) indicates a boundary condition at a center of the active material and an expression (6) indicates a boundary condition at an interface of the active material with the electrolytic solution (hereinafter also simply referred to as an "interface").

Herein, the active material's interface has a local lithium distribution in concentration, or a local SOC $\theta_j$, defined by an expression (7). In expression (7), $c_{sj,max}$ represents a concentration of lithium at the interface of the active material of the positive and negative electrodes, as indicated in an expression (8). Furthermore, represents a lithium concentration limit in the active material.

$$\frac{\delta[\varepsilon_{ej} \cdot c_{ej}(x,t)]}{\delta t} = \nabla \cdot [D_{ej}^{eff} \nabla c_{ej}(x,t)] + \frac{1-t_+^0}{F} \cdot j_j^{Li}(x,\theta_j,t) - \frac{i_{ej} \cdot \nabla t_+^0}{F} \quad (3)$$

$$\frac{\partial c_{sj}(x,r_j,t)}{\partial t} = D_{sj}\left[\frac{\partial^2 c_{sj}}{\partial r_j^2} + \frac{2}{r_j}\frac{\partial c_{sj}}{\partial r_j}\right] \quad (4)$$

$$\left.\frac{\partial c_{sj}(x,r_j,t)}{\partial r}\right|_{r_j=0} = 0 \quad (5)$$

$$\left.\frac{\partial[\varepsilon_{sj} \cdot c_{sj}(x,r_j,t)]}{\partial t}\right|_{r_j=r_{sj}} = -\frac{j_j^{Li}(x,\theta_j,t)}{a_{sj}F} \quad (6)$$

$$\theta_j = \frac{c_{sej}}{c_{sj,max}} \quad (7)$$

$$c_{sej} = c_{sj}(x, r_{sj}, t) \quad (8)$$

Furthermore, an expression (9) is established as an expression relating to the principle of conservation of charge in the electrolytic solution and an expression (10) is established as an expression relating to the principle of conservation of charge in the active material. Furthermore, an expression (11) is established as an expression of an electrochemical reaction caused at the active material's interface, indicating a relationship between a current density I(t) and a reaction current density $j_j^{Li}$.

$$\nabla \cdot [\kappa_j^{eff}(x,t)\nabla \phi_{ej}(x,t)] + \nabla \cdot [\kappa_{Dj}^{eff}(x,t)\nabla \ln c_{ej}(x,t)] + j_j^{Li}(x,\theta_j,t) = 0 \quad (9)$$

$$\nabla \cdot [\sigma_j^{eff}\nabla \phi_{sj}(x,t)] - j_j^{Li}(x,\theta_j,t) = 0 \quad (10)$$

$$I(t) = \int_0^L j_j^{Li}(x,\theta_j,t)dx \quad (11)$$

Simplifying the Battery Model Expression in the Present Embodiment

The primitive equations of expressions (1) to (11) are those disclosed in non-patent document 1. Exactly applying these battery model expressions to a state estimation device mounted in an actual device and estimating a secondary battery's state on line is, however, extremely difficult due to a restriction on an ECU's (battery ECU 50's) operating load and operating time. Accordingly in the present embodiment the battery model expression is simplified, as will be described hereinafter.

Figure 4:
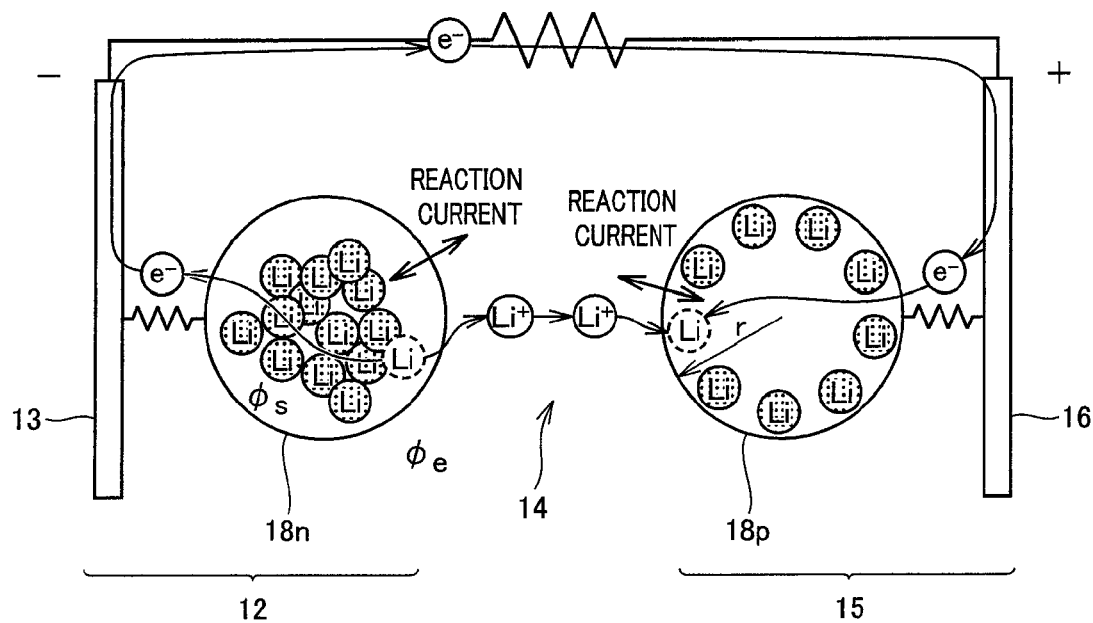
FIG. 4 conceptually illustrates an outline of modeling a secondary battery in the present embodiment.

With reference to FIG. 4, it is assumed in the present embodiment that negative electrode 12 and positive electrode 15 each have an electrochemical reaction uniformly. More specifically, it is assumed that each electrode 12, 15 has the reaction uniformly in a direction x. Furthermore, as it is assumed that negative electrode 12 and positive electrode 15 each internally have each active material's reaction uniformly, a single active material model will be handled in each of negative electrode 12 and positive electrode 15. Consequently, the FIG. 2 secondary battery's schematic structure is modeled as shown in FIG. 4.

In discharging, an electrode reaction is caused at a surface of the negative electrode's active material model 18n. Active material model 18n thus has a lithium atom Li discharging an electron $e^-$ and thus becoming a lithium ion $Li^+$ and thus discharged to an electrolytic solution in separator 14. In contrast, an electrode reaction caused at a surface of the positive electrode's active material model 18p allows the lithium ion $Li^+$ in the electrolytic solution to be taken in and the electron $e^-$ to be absorbed. The lithium atom Li is thus taken into the positive electrode's active material model 18p. As the negative electrode's active material model 18n discharges the lithium ion $Li^+$ and the positive electrode's active material model 18p takes the lithium ion $Li^+$ thereinto, a current flows from the positive electrode's current collector 16 toward the negative electrode's current collector 13.

In charging the secondary battery, in contrast, an electrode reaction caused at a surface of the negative electrode's active material model 18n allows a lithium ion $Li^+$ in the electrolytic solution to be taken in and an electrode reaction caused at a surface of the positive electrode's active material model 18p allows a lithium ion $Li^+$ to be discharged to the electrolytic solution. The battery model expression models: the electrode reaction at the surface of each of active material model 18p (j=1) and active material model 18n (j=2); how lithium diffuses in active material model 18p, 18n (as seen radially); how lithium ions diffuse in the electrolytic solution (i.e., how they are distributed in concentration); distributions in potential, temperature and the like at various sites, as the secondary battery is charged/discharged.

Figure 5:
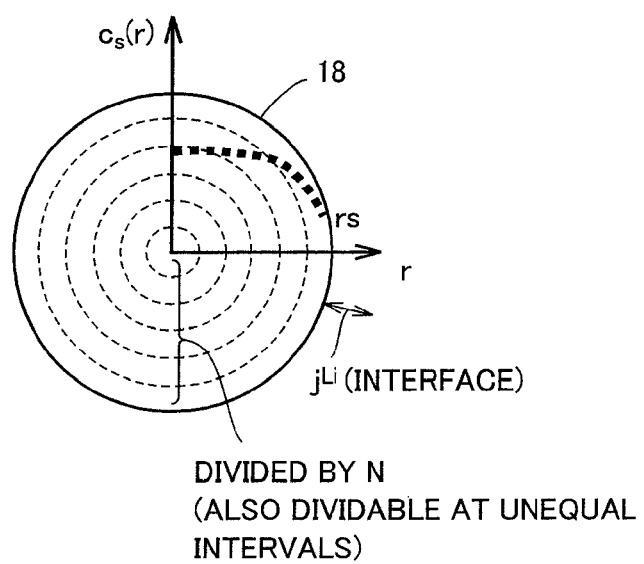
FIG. 5 conceptually illustrates a model of an active material represented by a polar coordinate.

As shown in FIG. 5, each active material model 18p, 18n has a lithium concentration $c_s$, which can be represented as a function on a radial coordinate r (r: a distance from a center of each point, $r_s$: a radius of the active material), assuming that it is position-independent as seen circumferentially. This active material model is provided to estimate a phenomenon of diffusion of lithium in the active material as an electrochemical reaction is caused at the interface, and for each of radially divided, N regions, a lithium concentration $c_{s,k}(t)$ is estimated in accordance with a diffusion equation, which will be described hereinafter, wherein N is a natural number of at least two and k=1 to N.

As a result of these assumptions, primitive equations (1) to (6) and (8) in non-patent document 1 are simplified to the following expressions (1') to (6') and (8'):

$$\frac{j_j^{Li}\#(\theta_j,t)}{a_{sj}} = i_{0j}\#(\theta_j,T,t) \cdot \left[\begin{array}{c}\exp\left(\frac{\alpha_{aj}F}{RT} \cdot \eta_j\#(\theta_j,t)\right) - \\ \exp\left(-\frac{\alpha_{aj}F}{RT} \cdot \eta_j\#(\theta_j,t)\right)\end{array}\right] \quad (1')$$

$$\eta_j\#(\theta_j,t) = \phi_{sj}\#(t) - \phi_{ej}\#(t) - U_j\#(\theta_j,t) \quad (2')$$

$$c_{ej}(t) = \text{const.} \quad (3')$$

$$\frac{\partial c_{sj}(r_j,t)}{\partial t} = D_{sj}\left[\frac{\partial^2 c_{sj}}{\partial r_j^2} + \frac{2}{r_j}\frac{\partial c_{sj}}{\partial r_j}\right] \quad (4')$$

$$\left.\frac{\partial c_{sj}(r_j,t)}{\partial r}\right|_{r_j=0} = 0 \quad (5')$$

$$\left.\frac{\partial[\varepsilon_{sj} \cdot c_{sj}(r_j,t)]}{\partial t}\right|_{r_j=r_{sj}} = -\frac{j_j^{Li}\#(\theta_j,t)}{a_{sj}F} \quad (6')$$

$$c_{sej} = c_{sj}(r_{sj},t) \quad (8')$$

In expression (3'), in particular, $c_{ej}(t)$ is assumed to have a constant value, assuming that the electrolytic solution is invariable in concentration with time. Furthermore, for active material models 18n, 18p, one defined for each electrode 12, 15, diffusion equations (4) to (6) are transformed into diffusion equations (4') to (6') with only a distribution in a direction of a polar coordinate considered. Note that expression (8') expresses a lithium concentration $c_{sej}$ at the material's interface, which corresponds to a lithium concentration $c_{si}(t)$ of an outermost one of the N regions shown in FIG. 5.

Furthermore, expression (9), which relates to the principle of conservation of charge in the electrolytic solution, is simplified to an expression (12), indicated below, by expression (3') assuming that the electrodes have an electrochemical reaction therein uniformly and that the electrolytic solution is invariable in concentration with time. More specifically, the electrolytic solution has a potential $\phi_{ej}$ approximated by a quadric of x, and an average potential $\phi_{ej}\#$ in the electrolytic solution used in calculating overvoltage $\eta_j\#$ is obtained by integrating expression (12) with respect to the electrode's thickness $L_j$, i.e., by an expression (13) indicated below.

For negative electrode 12, an expression (14) indicated below is established from expression (12), and accordingly, the electrolytic solution's average potential $\phi_{e2}\#$ and the electrolytic solution's potential at a boundary with separator 14 will have a difference in potential, as represented by an expression (15) indicated below. Similarly, for positive electrode 15, the electrolytic solution's average potential $\phi_{e1}\#$ and the electrolytic solution's potential at a boundary with separator 14 will have a difference in potential, as represented by an expression (16) indicated below.

$$\nabla \cdot [\kappa_j^{eff}(t)\nabla \phi_{ej}(x,t)] + j_j^{Li}\#(\theta_j, t) = 0 \Leftrightarrow \phi_{ej}(x,t) \quad (12)$$
$$= -\frac{j_j^{Li}\#(\theta_j, t)}{2\kappa_j^{eff}}x^2$$

$$\phi_{ej}\#(t) = -\frac{j_j^{Li}\#(\theta_j, t)}{2\kappa_j^{eff}}\frac{1}{L_j}\int_0^{L_j} x^2 dx \quad (13)$$
$$= -\frac{j_j^{Li}\#(\theta_j, t)}{6\kappa_j^{eff}} \cdot L_j^2$$

$$\phi_{e2}(L_2, t) = -\frac{j_2^{Li}\#(\theta_2, t)}{2\kappa_2^{eff}}L_2^2 \quad (14)$$

$$\phi_{e2}\#(t) - \phi_{e2}(L_2, t) = -\frac{j_2^{Li}\#(\theta_2, t)}{6\kappa_2^{eff}}L_2^2 - \left(-\frac{j_2^{Li}\#(\theta_2, t)}{2\kappa_2^{eff}}L_2^2\right) \quad (15)$$
$$= \frac{j_2^{Li}\#(\theta_2, t)}{3\kappa_2^{eff}}L_2^2$$
$$= \frac{L_2}{3\kappa_2^{eff}}I$$

$$\phi_{e1}\#(t) - \phi_{e1}(L_1, t) = -\frac{j_1^{Li}\#(\theta_1, t)}{3\kappa_1^{eff}}L_1^2 \quad (16)$$
$$= -\frac{L_1}{3\kappa_1^{eff}}I$$

Similarly, expression (10) relating to the principle of conservation of charge in the active material is also simplified to an expression (17) indicated below. More specifically, the active material also has a potential j approximated by a quadric of x, and an average potential $\phi_{sj}\#$ in the active material used in calculating overvoltage $\eta_j\#$ is obtained by integrating expression (17) with respect to the electrode's thickness $L_j$, i.e., by an expression (18) indicated below. Accordingly, similarly as described for the potential in the electrolytic solution, for positive electrode 15, the active material's average potential $\phi_{s1}\#$ and the active material's potential at a boundary with an electric collector (current collector 16) have a difference in potential, as indicated below by an expression (19). For negative electrode 12, an expression (20) is similarly established.

$$\nabla \cdot [\sigma_j^{eff}\nabla \phi_{sj}(x,t)] - j_j^{Li}\#(\theta_j, t) = 0 \Leftrightarrow \phi_{sj}(x,t) \quad (17)$$
$$= \frac{j_j^{Li}\#(\theta_j, t)}{2\sigma_j^{eff}}x^2$$

$$\phi_{sj}\#(t) = \frac{j_j^{Li}\#(\theta_j, t)}{2\sigma_j^{eff}}\frac{1}{L_j}\int_0^{L_j} x^2 dx \quad (18)$$

$$\phi_{s1}\#(t) - \phi_{s1}(L_1, t) = -\frac{j_1^{Li}\#(\theta_1, t)}{3\sigma_1^{eff}}L_1^2 \quad (19)$$
$$= \frac{L_1}{3\sigma_1^{eff}}I$$

$$\phi_{e2}\#(t) - \phi_{s2}(L_2, t) = -\frac{j_2^{Li}\#(\theta_2, t)}{3\sigma_2^{eff}}L_2^2 \quad (20)$$
$$= -\frac{L_2}{3\sigma_2^{eff}}I$$

Figure 6:
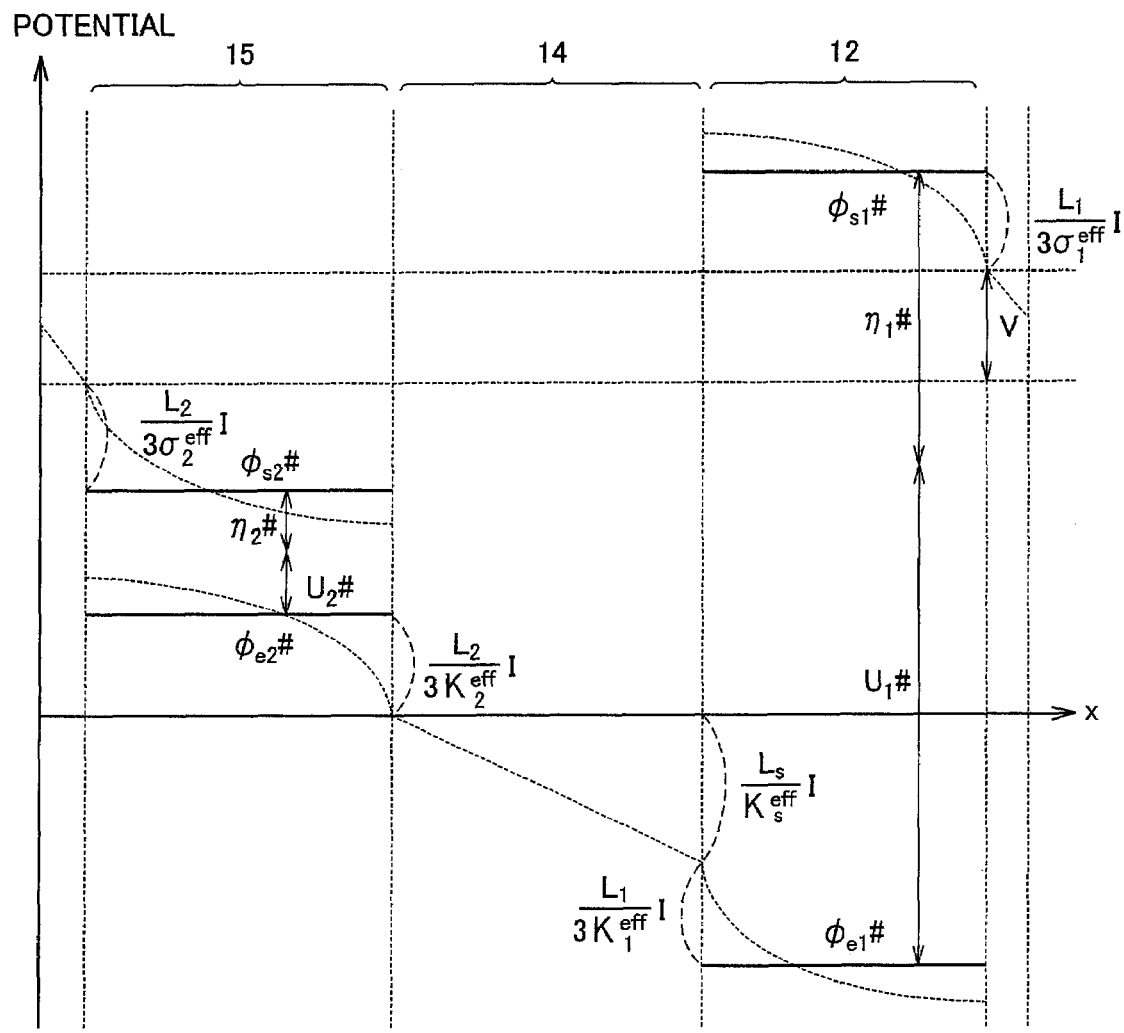
FIG. 6 conceptually illustrates a relationship of a voltage of a terminal of a secondary battery and each average potential.

FIG. 6 represents a relationship between voltage V(t) of a terminal of the secondary battery and each average potential obtained as described above. Note that in FIG. 6, separator 14 has a reaction current density $j_j^{Li}=0$ and accordingly, a voltage drop in separator 14 is proportional to current density I(t) and thus will be $L_s/\kappa_s^{eff} \cdot I(t)$.

Furthermore, as it is assumed that each electrode internally has an electrochemical reaction uniformly, as described above, an expression (21) will be established between current density I(t) and reaction current density (or an amount of lithium generated) $j_j^{Li}$ per a unit area of the electrode's plate, as follows:

$$I(t) = -j_1^{Li}(\theta_1, t)L_1 = j_2^{Li}(\theta_2, t)L_2 \quad (21)$$

Thus from the FIG. 6 relationship in potential and expression (21) an expression (22) indicated below is established for the battery's voltage V(t). Note that expression (22) is based on the relational expression in potential of expression (23) shown in FIG. 6.

Subsequently, an average overvoltage $\eta\#(t)$ is calculated. If $j_j^{Li}$ is constant and in Butler-Volmer's relational expression, $\alpha_{aj} = \alpha_{cj} = 0.5$ (i.e., if charging and discharging are done equally in efficiency) then an expression (24) indicated below is established. By inversely transforming expression (24), average overvoltage $\eta\#(t)$ is obtained by an expression (25) indicated below.

$$V(t) = \phi_{s1}\#(t) - \frac{L_1}{3\sigma_1^{eff}}I(t) - \left(\phi_{s2}\#(t) - \frac{L_2}{3\sigma_2^{eff}}I(t)\right) \quad (22)$$

$$\phi_{sj}\#(t) = U_j\#(t) + \phi_{ej}\#(t) + \eta_j\#(t) \quad (23)$$

$$j_j^{Li}\# = a_{sj}i_{0j}(\theta_j, t) \cdot \left[\exp\left(\frac{\alpha_{aj}F}{RT} \cdot \eta_j\#(t)\right) - \exp\left(-\frac{\alpha_{cj}F}{RT} \cdot \eta_j\#(t)\right)\right] \quad (24)$$
$$= 2a_{sj}i_{0j}(\theta_j, t)\sinh\left(\frac{\alpha_{aj}F}{RT} \cdot \eta_j\#(t)\right)$$

$$\eta_j\#(t) = \frac{RT}{\alpha_{aj}F}\text{arcsinh}\left(\frac{j_j^{Li}\#(\theta_j, t)}{2a_{sj}i_{0j}(\theta_j, t)}\right) \quad (25)$$

Then, in accordance with FIG. 6, average potentials $\phi_{s1}$ and $\phi_{s2}$ are obtained and substituted into expression (22) and furthermore, average overvoltages $\eta_1\#(t)$ and $\eta_2\#(t)$ obtained by expression (25) are substituted into expression (22). As a result, as based on simplified electrochemical reaction expressions (1'), (21) and relational expression in voltage (2'), a voltage-current relationship model expression (M1a) is derived in accordance with an electrochemical reaction model expression, as indicated below.

Furthermore, by a principle of conservation of lithium in concentration (a diffusion equation) or expression (4') and boundary condition expressions (5') and (6'), an active material diffusion model expression (M2a) is obtained for active material models 18p and 18n at positive electrode 15 and negative electrode 12, respectively.

$$V(t) = U_1\#(\theta_1, t) - U_2\#(\theta_2, t) + \frac{RT}{\alpha_{a1}F}\left\{\begin{array}{l}\operatorname{arcsinh}\left(\frac{-I(t)}{2L_1 a_{s1} i_{01}(\theta_1, T, t)}\right) - \\ \operatorname{arcsinh}\left(\frac{-I(t)}{2L_2 a_{s2} i_{02}(\theta_2, T, t)}\right)\end{array}\right\} - I(t)\underbrace{\left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right)}_{Rd(T)} \quad (M1a)$$

$$\frac{\partial c_{s1}(r_1, t)}{\partial t} = D_{s1}(T)\left[\frac{\partial^2 c_{s1}}{\partial r_1^2} + \frac{2}{r_1}\frac{\partial c_{s1}}{\partial r_1}\right] \quad (M2a)$$
$$\frac{\partial c_{s2}(r_2, t)}{\partial t} = D_{s2}(T)\left[\frac{\partial^2 c_{s2}}{\partial r_2^2} + \frac{2}{r_2}\frac{\partial c_{s2}}{\partial r_2}\right]$$

Note that in model expression (M1a) on the right-hand side the first term indicates an open circuit voltage (OCV) determined by a concentration of a reactant material (lithium) that is obtained at a surface of the active material and the second term indicates overvoltage ($\eta_1\#-\eta_2\#$) and the third term indicates a voltage drop attributed to the battery's current. More specifically, the secondary battery's pure direct current resistance is represented in expression (M1a) by Rd(T).

Figure 7:
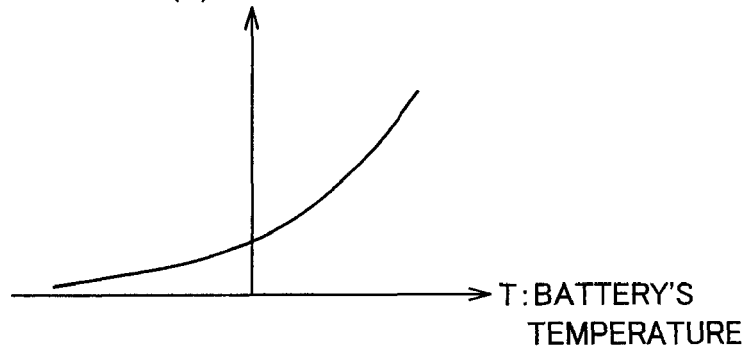
FIG. 7 conceptually illustrates a dependence of a diffusion coefficient on temperature.

Furthermore in expression (M2a) diffusion coefficients $D_{s1}$ and $D_{s2}$ used as a parameter value defining a diffusion rate of the reactant material, or lithium, are temperature-dependent. Accordingly, diffusion coefficients $D_{s1}$ and $D_{s2}$ are set, for example in accordance with a map shown in FIG. 7, as a variable parameter value set variably relative to the battery's temperature T detected by temperature sensor 30. As shown in FIG. 7, diffusion coefficients $D_{s1}$ and $D_{s2}$ have a characteristic that relatively decreases when the battery has low temperature and that relatively increases as the battery's temperature increases. Accordingly such temperature dependence is reflected in previously preparing a map setting diffusion coefficients $D_{s1}$ and $D_{s2}$ in expression (M2a) as a parameter value of the battery in accordance with the battery's temperature T detected in accordance with a value Tb detected by temperature sensor 30.

Note that if necessary, diffusion coefficients $D_{s1}$ and $D_{s2}$ may be dependent not only on temperature but also local SOC $\theta$, and in that case, a two dimensional map is previously prepared that sets these diffusion coefficients as a parameter value in accordance with the battery's temperature T as detected and a local SOC $\theta$ as estimated.

Figure 8A:
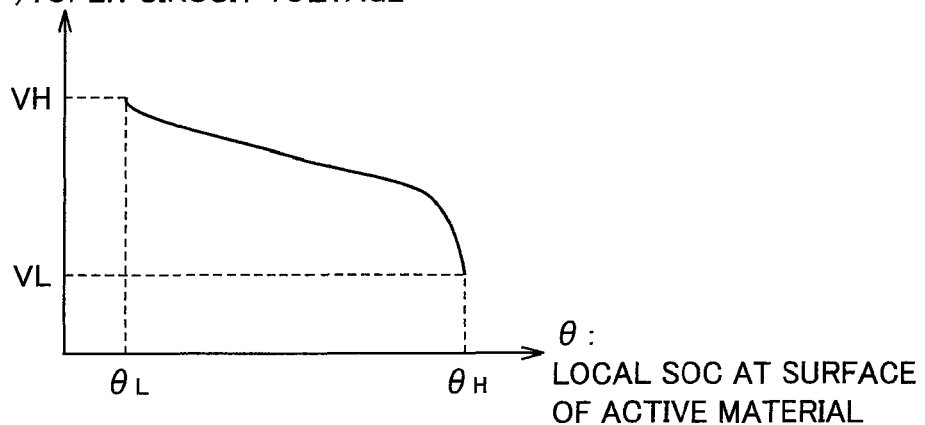
FIG. 8A and FIG. 8B conceptually show a relationship between open circuit voltage and local SOC.
Figure 8B:
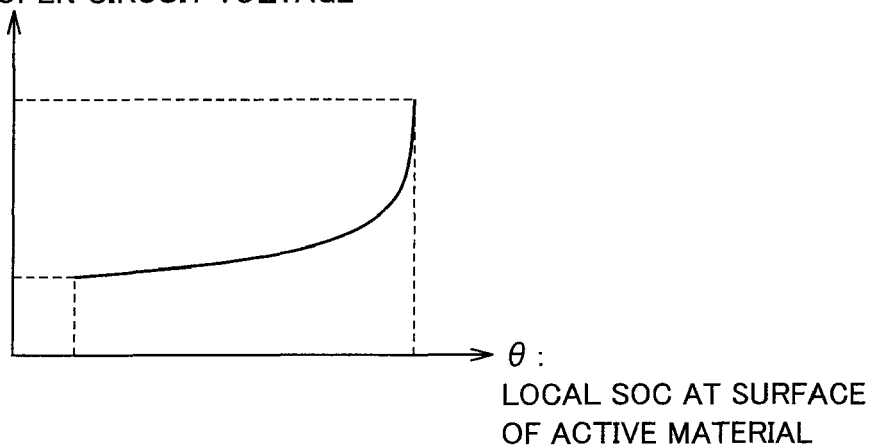

Similarly in expression (M1a) open circuit voltages $U_1$ and $U_2$ also have a dependence increasing or decreasing as local SOC $\theta$ decreases, as shown in FIG. 8A and FIG. 8B. Accordingly, such local SOC dependence is reflected in previously setting a map setting open circuit voltages $U_1$ and $U_2$ in expression (M1a) in accordance with local SOC $\theta$ as estimated. Note that FIG. 8A represents dependence of open circuit voltage $U_1$ on local SOC $\theta$ at the positive electrode (j=1) and FIG. 8B represents dependence of open circuit voltage $U_1$ on local SOC $\theta$ at the negative electrode (j=2).

Furthermore, although not shown in a figure, in expression (M1a), exchange current densities $i_{01}$ and $i_{02}$ also have dependence on local SOC $\theta$ and the battery's temperature T, and accordingly, a two dimensional map with $\theta$ and T serving as arguments is previously prepared and exchange current densities $i_{01}$ and $i_{02}$ are determined as a parameter value of the battery in accordance with local SOC $\theta$ currently obtained and the battery's temperature T currently obtained.

Similarly, pure direct current resistance Rd is also temperature dependent, and accordingly, the temperature dependence is reflected in previously preparing a map setting pure direct current resistance Rd as a parameter value of the battery in accordance with the battery's temperature T detected in accordance with value Tb detected by temperature sensor 30.

Note that the present specification describes for confirmation that the group of maps as described above can be prepared based on a result of an experiment such as a well known, alternate current impedance measurement or the like.

Battery Model Expression in First Exemplary Variation: Sharing an Active Material Model FIG. 4 shows a method that employs separate active material models for negative electrode 12 and positive electrode 15, respectively. Alternatively, negative electrode 12 and positive electrode 15 may share an active material model to provide a modeling that contemplates a further alleviated operating load. In that case, the negative electrode 12 and positive electrode 15 active material models 18n and 18p are collectively handled as a single element. Accordingly, substituting an expression such as indicated by an expression (26) will be required, as indicated below. Expression (26) does not have the subscripted letter "j" distinguishing the positive electrode and the negative electrode.

$$\left.\begin{array}{l}U(\theta, t) = U_1\#(\theta_1, t) - U_2\#(\theta_2, t) \\ i_{0j}(\theta_j, T, t) = i_0(\theta, T, t) \\ c_{sj}(r_j, t) = c_s(r, t) \\ D_{sj} = D_s \\ a_{sj} = a_s \\ L_j = L \\ \alpha_{sj} = \alpha_s \\ \theta_j = \theta_1\end{array}\right\} \quad (26)$$

As a result, model expressions (M1a) and (M2a) that are further simplified to a model, i.e., expressions (M1b) and (M2b), are obtained, as indicated below. Furthermore, a battery model expression having applied thereto an active material model shared by the positive electrode and the negative electrode has current density I(t) and reaction current density $j_j^{Li}$ in a relational expression of an expression (21') rather than (21).

$$V(t) = U(\theta, t) + \frac{RT}{\alpha_a F} \text{arcsinh}\left(\frac{-I(t)}{2L a_s i_0(\theta, T, t)}\right) - \quad \text{(M1b)}$$

$$I(t) \underbrace{\left(\frac{L_1}{3\kappa_1^{\text{eff}}} + \frac{L_s}{3\kappa_s^{\text{eff}}} + \frac{L_2}{3\kappa_2^{\text{eff}}} + \frac{L_1}{3\sigma_1^{\text{eff}}} + \frac{L_2}{3\sigma_2^{\text{eff}}}\right)}_{Rd(T)}$$

$$\frac{\partial c_s(r, t)}{\partial t} = D_s\left[\frac{\partial^2 c_s}{\partial r^2} + \frac{2}{r} \frac{\partial c_s}{\partial r}\right] \quad \text{(M2b)}$$

$$I(t) = -L \cdot j^{Li} \#(\theta, t) \quad (21')$$

Battery Model Expression in Second Exemplary Variation: Linearly Approximating a Polarization Potential Term

Expression (M1a) indicated above has an arcsin h term on the right-hand side at the second term indicating overvoltage. Accordingly, it is necessary to solve a non-linear expression. Accordingly, operating expression (M1a) requires a repetitive calculation, which may results in an increased operating load and in addition thereto impaired operation stability. Accordingly, expression (M1a) having the arcsin h term with a simple approximation (or a linear approximation) applied thereto, i.e., a voltage-current relationship model expression (M1c), is derived.

$$V(t) = U_1\#(\theta_1, t) - U_2\#(\theta_2, t) + \quad \text{(M1c)}$$
$$\frac{RT}{\alpha_{a1} F} \frac{-I(t)}{2L_1 a_{s1} i_{01}(\theta_1, T, t)} - \frac{RT}{\alpha_{a1} F} \frac{-I(t)}{2L_2 a_{s2} i_{02}(\theta_2, T, t)} -$$

$$I(t) \underbrace{\left(\frac{L_1}{3\kappa_1^{\text{eff}}} + \frac{L_s}{3\kappa_s^{\text{eff}}} + \frac{L_2}{3\kappa_2^{\text{eff}}} + \frac{L_1}{3\sigma_1^{\text{eff}}} + \frac{L_2}{3\sigma_2^{\text{eff}}}\right)}_{Rd(T)}$$

$$Rr(\theta_1, \theta_2, T) = \frac{RT}{2\alpha_{a1} F}\left\{\frac{1}{L_1 a_{s1} i_{01}(\theta_1, T)} + \frac{1}{L_2 a_{s2} i_{02}(\theta_2, T)}\right\} \quad (27)$$

$$V(t) = U_1\#(\theta_1, t) - U_2\#(\theta_2, t) - Rr(\theta_1, \theta_2, T)I(t) - Rd(T) \cdot I(t) \quad (28)$$

Note that in expression (M1c) as a result of the linear approximation the right-hand side's second term will also be indicated by a product of current density I(t) and reaction resistance Rr. Reaction resistance Rr has dependence on local SOC $\theta$ and the battery's temperature T with respect to exchange current densities $i_{0i}$, $i_{02}$, as indicated above by an expression (27). Accordingly, if voltage-current relationship model expression (M1c) is used, it will also be necessary to previously prepare a map that reflects dependence on local SOC $\theta$ and the battery's temperature T for reaction resistance $Rr(\theta_i, T)$ in accordance with a result of an experiment or the like and set the reaction resistance with reference to the map as a parameter of the battery, as appropriate.

Consequently, voltage-current relationship model expression (M1c) will be represented as a linear model expression established between the battery's voltage V(t), the battery's current density I(t), $Rr(\theta, T)$ and Rd(T) serving as a parameter of the battery, and open circuit voltages $U_1$, $U_2$, as indicated above in an expression (28).

Similarly, expression (M1b) indicated above also has an arcsin h term on the right-hand side at the second term linearly approximated to provide an expression (M1d) as indicated below. As well as expression (M1c), expression (M1d) is also expressed as a linear model expression.

$$V(t) = U(\theta, t) + \frac{RT}{\alpha_a F} \frac{-I(t)}{2L_1 a_s i_0(\theta, t)} - \quad \text{(M1d)}$$
$$- Rr(\theta, T) \cdot I(t)$$

$$I(t) \underbrace{\left(\frac{L_1}{3\kappa_1^{\text{eff}}} + \frac{L_s}{3\kappa_s^{\text{eff}}} + \frac{L_2}{3\kappa_2^{\text{eff}}} + \frac{L_1}{3\sigma_1^{\text{eff}}} + \frac{L_2}{3\sigma_2^{\text{eff}}}\right)}_{Rd(T)}$$

Configuration of Device Estimating a State of Secondary Battery According to First Embodiment

Hereinafter will be described a configuration of a device estimating a state of a secondary battery according to the first embodiment of the present invention that is implemented by a combination of any of voltage-current relationship model expressions (M1a) to (M1d) and active material diffusion model (M2a) or (M2b) corresponding thereto. Note that it is assumed that the state estimation device described hereinafter is implemented basically by the FIG. 1 battery ECU 50 processing a program.

Figure 9:
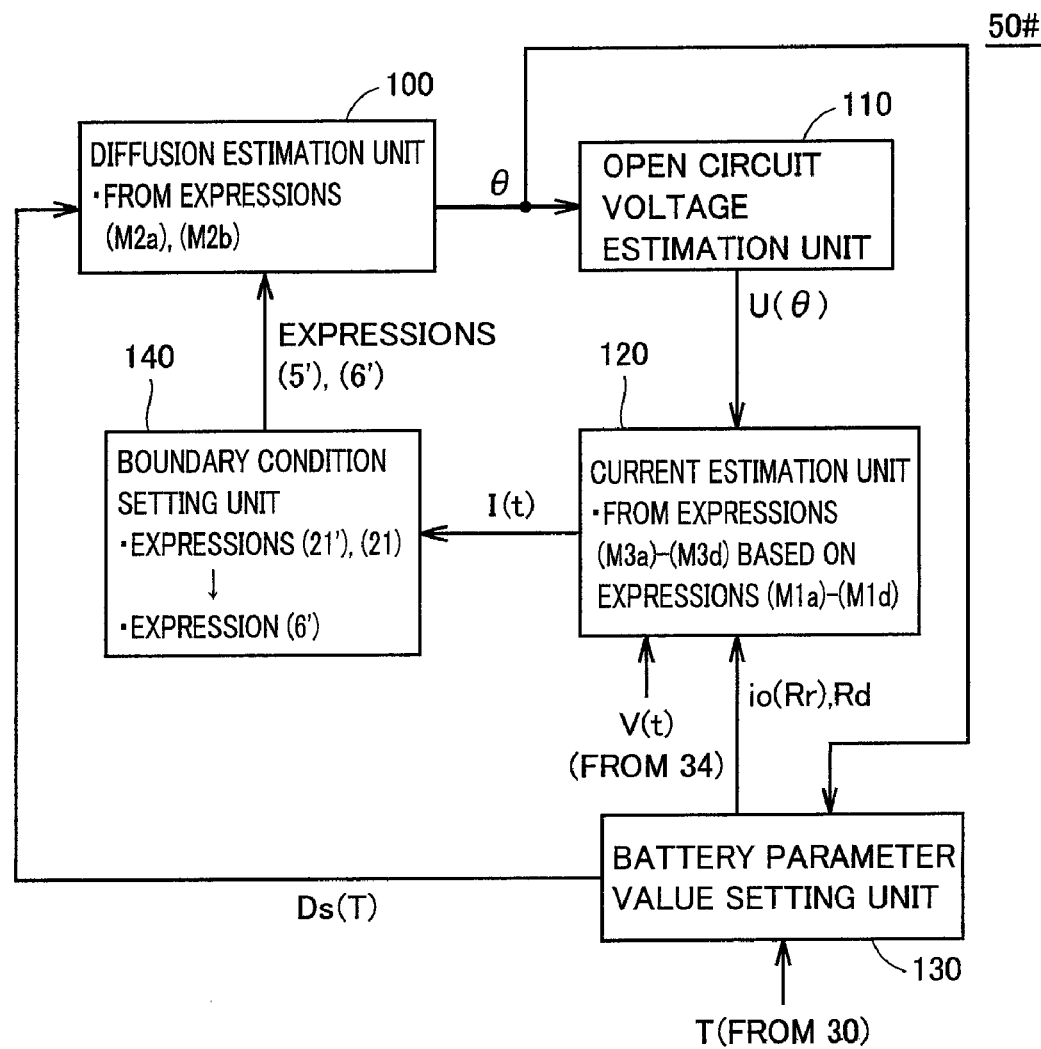
FIG. 9 is a block diagram schematically illustrating a configuration of a device estimating a state of a secondary battery according to a first embodiment.

FIG. 9 is a block diagram schematically illustrating a configuration of a device estimating a state of a secondary battery according to the first embodiment of the present invention. FIG. 9 shows blocks, which are implemented basically by battery ECU 50 processing a program.

With reference to FIG. 9, a state estimation device 50# includes a diffusion estimation unit 100, an open circuit voltage estimation unit 110, a current estimation unit 120, a battery parameter value setting unit 130, and a boundary condition setting unit 140.

Diffusion estimation unit 100 uses active material diffusion model expression (M2a) or (M2b), as based on a boundary condition set by boundary condition setting unit 140 in accordance with expressions (5') and (6'), to sequentially perform an operation to obtain a distribution in concentration of lithium in the active material by differential formula, for example. Diffusion estimation unit 100 thus estimates a distribution in concentration of lithium, and based thereon, with the outermost region's lithium concentration serving as lithium concentration $c_{sej}$ obtained at the interface of the material, local SOC $\theta$ is set in accordance with expression (7).

Open circuit voltage estimation unit 110 obtains in accordance with a map reflecting a characteristic indicated in FIG. 8A and FIG. 8B the positive and negative electrodes' respective open circuit voltages or an open circuit voltage of a composite of the positive electrode and the negative electrode. In FIG. 9, these will be indicated collectively as an open circuit voltage U($\theta$).

Battery parameter value setting unit 130 sets a parameter for the battery in a battery model expression that is used in accordance with the battery's temperature T detected in accordance with value Tb detected by temperature sensor 30 and the current local SOC $\theta$ based on the estimation done by diffusion estimation unit 100. As has been described above, diffusion constants $D_{s1}$, $D_{s2}$, $D_s$ in model expressions (M2a), (M2b) that are used in diffusion estimation unit 100 are set in accordance with the battery's temperature T, and other than that, pure direct current resistance Rt in model expressions (M1a) to (M1d), or exchange current densities $i_{01}$, $i_{02}$ in model expressions (M1a), (M1b) or reaction resistance Rr in model expressions (M1c), (M1d), and the like are set by battery parameter value setting unit 130.

Based on expressions (M1a) to (M1d), current estimation unit 120 follows any of expressions (M3a) to (M3d), as indicated below, substituting open circuit voltage U($\theta$) estimated by open circuit voltage estimation unit 110 and the battery's current voltage V(t) detected in accordance with value Vb detected by voltage sensor 34, to calculate the battery's current density I(t).

$$h[I(t)] = V(t) - U_1\#(\theta_1, t) + U_2\#(\theta_2, t) - \quad \text{(M3a)}$$

$$\frac{RT}{\alpha_{a1}F} \left\{ \begin{array}{l} \operatorname{arcsinh}\left(\frac{-I(t)}{2L_2 a_{s2} i_{01}(\theta_2, T, t)}\right) - \\ \operatorname{arcsinh}\left(\frac{I(t)}{2L_2 a_{s2} i_{02}(\theta_2, T, t)}\right) \end{array} \right\} +$$

$$I(t)\underbrace{\left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right)}_{Rd(T)}$$

For example, expression (M3a) corresponds to expression (M1a) solved for the battery's current density I(t) If expression (M3a), which is a nonlinear equation, is solved in Newton's method or the like, it can be solved by assuming an initial value of I(t) and furthermore, substituting the battery's voltage V(t), open circuit voltage U(θ) and a battery parameter value to calculate I(t), and iteratively performing a calculation until the calculated I(t) matches the assumed I(t).

Similarly, for a battery model expression using expression (M1b), the battery's current density I(t) can be calculated by solving expression (M3b) by a method similar to that applied to expression (M3a).

$$h[I(t)] = V(t) - U(\theta, t) - \frac{RT}{\alpha_a F}\operatorname{arcsinh}\left(\frac{-I(t)}{2La_s i_0(\theta, T, t)}\right) + \quad \text{(M3b)}$$

$$I(t)\underbrace{\left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right)}_{Rd(T)}$$

Furthermore, for a battery model expression of linearly approximated expressions (M1c) and (M1d), expressions (M3c) and (M3d) are used: the battery's voltage V(t), open circuit voltage U(θ) and a battery parameter value are substituted, and without performing an iterative calculation as done for a nonlinear equation, the battery's current density I(t) can uniquely be calculated. An alleviated operating load and increased operation stability can thus be achieved.

$$I(t) = \frac{U_1\#(\theta_1, t) - U_2\#(\theta_2, t) - V(t)}{Rr(\theta_1, \theta_2, T) + Rd(T)} \quad \text{(M3c)}$$

$$I(t) = \frac{U(\theta, t) - V(t)}{Rr(\theta, T) + Rd(T)} \quad \text{(M3d)}$$

Subsequently, boundary condition setting unit 140 follows expression (21) or (21') to convert the current density I(t) obtained through an operation into a reaction current density (an amount of lithium generated) $j_j^{Li}$, and follows expression (6') to update a boundary condition for the active material diffusion model expressions (M2a), (M2b).

Thus in accordance with the first embodiment a device estimating a state of a secondary battery can receive the battery's voltage V(t) based on a value measured by voltage sensor 34 and the battery's current temperature T based on a value measured by temperature sensor 30 and accordingly provide an estimation based on diffusion model expressions (M2a), (M2b) for a reactant material (lithium) contained in an active material, and combine it with simplified voltage-current relationship model expressions (M1a) to (M1d) according to an electrochemical reaction model expression to estimate how the reactant material (lithium) is distributed in concentration in the active material, and based thereon, estimate the secondary battery's internal state with high precision. Thus a battery model expression can be implemented that is suitable for being mounted in an actual device, that adopts a simplified electrochemical reaction model expression to alleviate an operating load and allows a secondary battery's internal state to be estimated from an electrochemical reaction with high precision.

The device estimating a state of a secondary battery according to the first embodiment can use the secondary battery's estimated internal state to further estimate the state of charge (SOC) of secondary battery 10.

Figure 10:
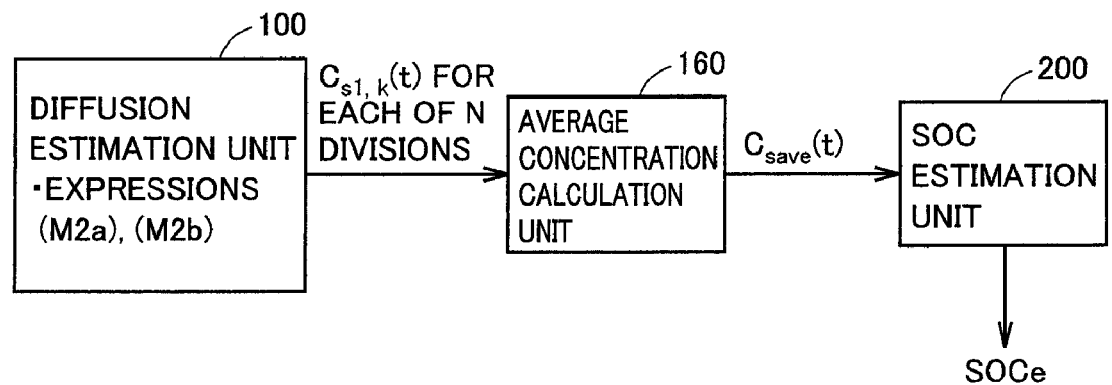
FIG. 10 is a block diagram illustrating an SOC estimation configuration of the device estimating a state of a secondary battery according to the first embodiment.

FIG. 10 illustrates how the device estimating a state of a secondary battery according to the first embodiment estimates SOC.

With reference to FIG. 10, the device estimating a state of a secondary battery according to the first embodiment further includes an average concentration calculation unit 160 and an SOC estimation unit 200.

Average concentration calculation unit 160 uses an expression (29) indicated below to obtain an average lithium concentration $c_{save}(t)$ in the positive electrode's active material model 18p that is estimated by diffusion estimation unit 100. Furthermore, SOC estimation unit 200 follows an expression (30), as indicated below, to generate an estimated SOC value SOCe for the entirety of secondary battery 10.

$$c_{save}(t) = \sum_{k=1}^{N} c_{s1,k}(t) \cdot \frac{\Delta V_k}{V} \quad \text{(29)}$$

$$SOC\# = \frac{CO - c_{save}(t)}{CO - Cf} \cdot 100(\%) \quad \text{(30)}$$

As described above, lithium concentration $c_{s1,k}(t)$ in expression (29) is that of each region of active material model 18p radially divided by N, as shown in FIG. 5, wherein k=1 to N, and is estimated through diffusion model expressions (M2a), (M2b). Furthermore, $\Delta V_k$ represents each region's volume and V represents the active material's entire volume.

Furthermore, if the positive and negative electrodes share an active material model, then average lithium concentration $c_{save}(t)$ can be obtained by obtaining an average value of a lithium concentration $c_{s,k}(t)$ of each region in the shared active material model, wherein k=1 to N, similarly as done for expression (29).

Figure 11:
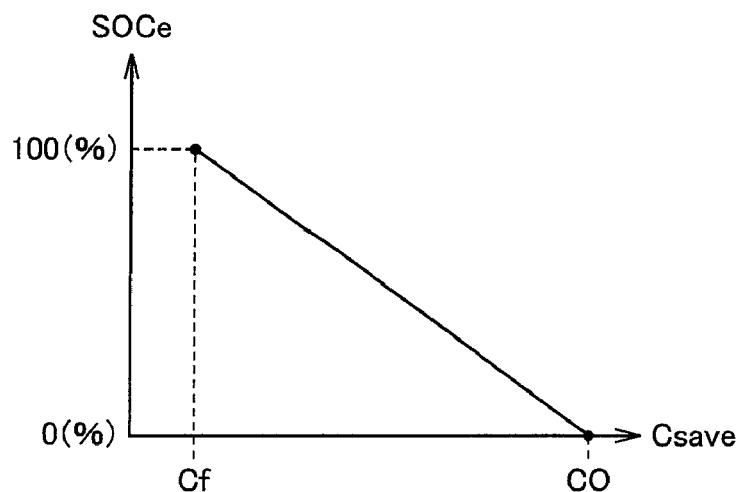
FIG. 11 shows a relationship between an average lithium concentration in an active material and a state of charge (SOC).

FIG. 11 represents as one example a relationship of an average lithium concentration in an active material of positive electrode 15 and estimated SOC value SOCe. As shown in FIG. 11, as the average lithium concentration in the active material of the positive electrode increases, the SOC decreases. Accordingly, previously obtaining an average lithium concentration Cf that is obtained when the battery is fully charged (i.e., for SOC=100%) and an average lithium concentration CO that is obtained when the battery is completely discharged (i.e., for SOC=0%) and linearly interpolating them allows an SOC to be estimated in accordance with expression (30).

Figure 12:
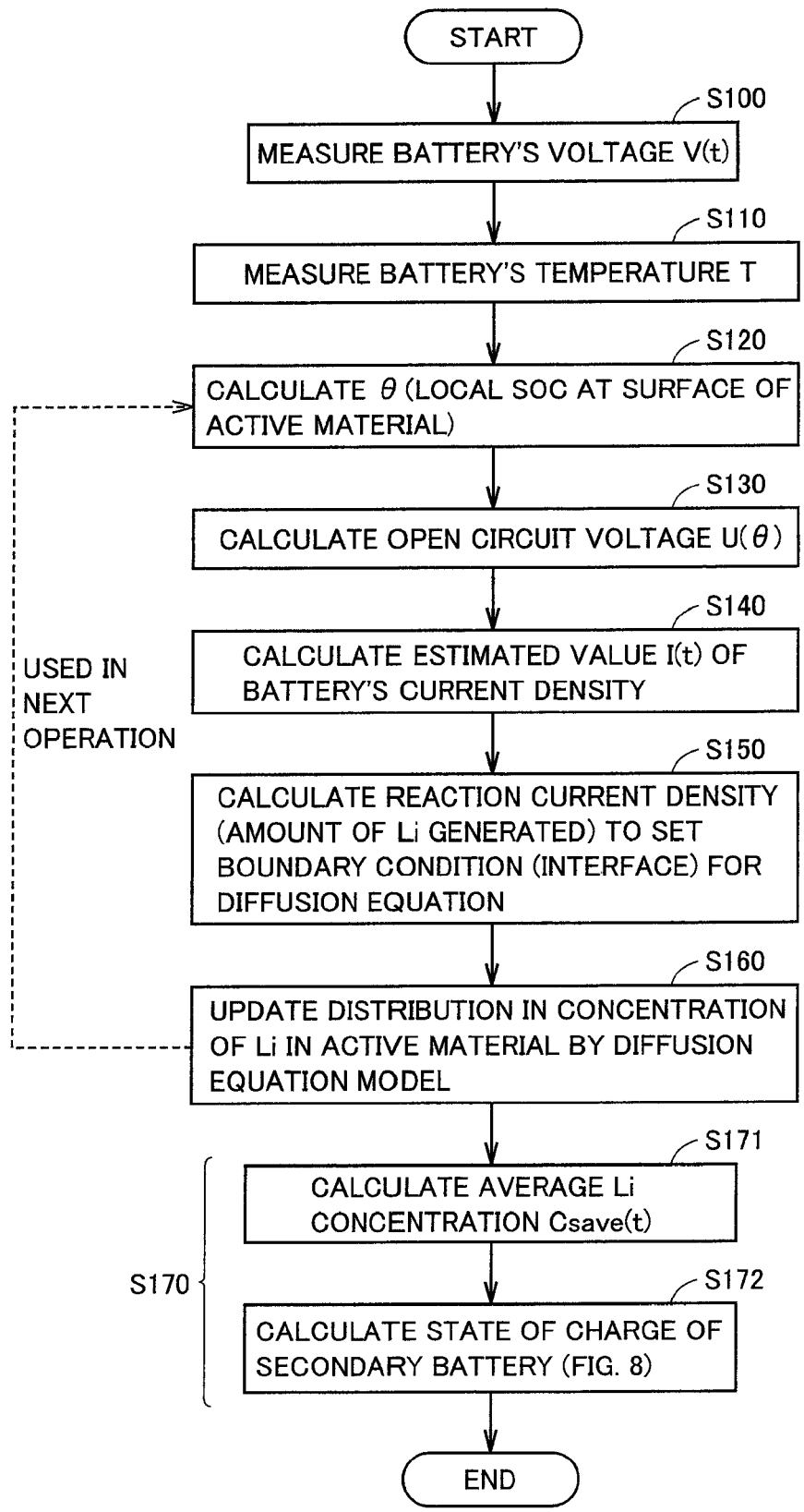
FIG. 12 is a flowchart for illustrating how the device estimating a state of a secondary battery according to the first embodiment estimates the battery's state and SOC through a process having a series of steps.

FIG. 12 is a flowchart for illustrating how the device estimating a state of a secondary battery according to the first embodiment estimates the battery's state and SOC through a process having a series of steps. The FIG. 12 series of steps is invoked and executed by battery ECU 50 for each predetermined operating period.

With reference to FIG. 12, battery ECU 50 in step S100 obtains the battery's voltage V(t) based on value Vb detected by voltage sensor 34 and in step S110 obtains the battery's current temperature T based on value Tb detected by temperature sensor 30.

Furthermore, battery ECU 50 in step S120 calculates local SOC θ based on a lithium concentration of a surface of the active material, as based on a distribution in concentration of lithium obtained in an operation previously performed through diffusion model expressions (M2a), (M2b).

Then, battery ECU 50 in step S130 refers to a map following the characteristics shown in FIG. 8A, FIG. 8B to calculate a value of open circuit voltage U(θ) from local SOC θ for each of negative electrode 12 and positive electrode 15 or the positive and negative electrodes commonly. More specifically, step S130 corresponds to a function of open circuit voltage estimation unit 110 shown in FIG. 9.

Furthermore, battery ECU 50 in step S140 calculates an estimated value of the battery's current density I(t) by a function of current estimation unit 120 that is indicated in FIG. 9 in accordance with any of voltage-current relationship model expressions (M1a) to (M1d) in accordance with a battery parameter value that is set in accordance with the battery's voltage V(t), open circuit voltage U(θ) and the battery's temperature T.

Furthermore, battery ECU 50 in step S150 calculates reaction current density (or an amount of lithium generated) $j_j^{Li}$ from the battery's estimated current density I(t), as based on expression (21) or (21'), and uses the calculated reaction current density to set a boundary condition for diffusion model equations (M2a), (M2b) for an interface of the active material (i.e., the active material's interface). More specifically, step S150 corresponds to a function of boundary condition setting unit 140 shown in FIG. 9.

Then, battery ECU 50 in step S160 follows diffusion equation models (M2a), (M2b) to calculate how lithium is distributed in concentration in an active material model set for each of negative electrode 12 and positive electrode 15 or the positive and negative electrodes commonly, and battery ECU 50 updates each region's estimated lithium concentration value. More specifically, step S160 corresponds to a function of diffusion estimation unit 100 shown in FIG. 9. Note that, as has been described above, at the time the concentration of lithium in the outermost divided region is obtained through an operation, and the obtained concentration is used in subsequently executing an operation when local SOC θ is calculated for a surface of the active material.

As a further step, battery ECU 50 can perform step S170 to estimate a state of charge (SOC) for the entirety of secondary battery 10, based on the secondary battery's internal state obtained through steps S100 to S160.

For example, step S170 is configured of step S171 of calculating average lithium concentration $c_{save}$ based on the distribution in concentration of lithium in the active material, as obtained in step S160, and step S172 of calculating the secondary battery's state of charge based on average lithium concentration $c_{save}$ obtained in step S171. Step S171 corresponds to a function of average concentration calculation unit 160 shown in FIG. 10 and step S172 corresponds to a process performed by SOC estimation unit 200 shown in FIG. 10.

Thus the device estimating a secondary battery's charge according to the first embodiment receives the battery's voltage V(t) and accordingly estimates the battery's current (the battery's current density I(t)), and therefrom estimates the secondary battery's internal state. As such, as will be described hereinafter with reference to FIG. 13, it will have a function of self-modifying a model error.

With reference to FIG. 13, as can be understood with reference to battery model expression (M1a) and the like, when secondary battery 10 is charged, a polarization potential ΔV is caused between the battery's voltage V(t) and open circuit voltage OCV, as shown in FIG. 13, and, as can also be understood from linearly approximated expressions (M1c), (M1d), this polarization potential will have a value in accordance with the battery's current density I.

Accordingly, if a battery model should have an operation error caused therein and open circuit voltage is underestimated relative to a true value, i.e., OCV (estimated)<OCV (true value) and SOC (estimated)<SOC (true value), and polarization ΔV (estimated)>ΔV (true value). Then, the battery's current density I(t) will be overestimated relative to a true value. As a result, reaction current density $j_j^{Li}$ is also overestimated through expressions (21), (21'), and accordingly, in a subsequent operating period, an amount of SOC that is increased will be overestimated, and a model error relevant to SOC will be self-modified. Similarly, if open circuit voltage is overestimated relative to a true value, a model error relevant to SOC can be self-modified in a direction opposite to the above.

In other words, the device estimating a secondary battery's charge according to the first embodiment allows a model estimation error that has once caused to be self-modified in a subsequent operation. A battery model error is not accumulated, and the secondary battery's internal state and state of charge (SOC) can be estimated with high precision.

Second Embodiment

In a second embodiment will be described another method of estimating an SOC based on a result of estimating an internal state of a secondary battery according to the first embodiment.

FIG. 14 is a block diagram for illustrating how a device estimating a state of a secondary battery estimates an SOC according to the second embodiment.

With reference to FIG. 14, the device estimating a state of a secondary battery according to the second embodiment includes an offset estimation unit 170, a current accumulation unit 180, and an SOC estimation unit 210.

Offset estimation unit 170 calculates an offset error Iof of current sensor 32 in accordance with an expression (31), indicated below, as based on the battery's current density I(t) estimated by current estimation unit 120 and the battery's current Ib(t) measured by current sensor 32. In expression (31), a model battery current Im(t) is obtained by multiplying the battery's current density I(t) estimated by current estimation unit 120 by the electrode's surface area. As indicated in expression (31), offset estimation unit 170 accumulates a deviation of model battery current Im(t) and the battery's current Ib(t) measured by current sensor 32 and divides the cumulative value by an accumulation time Tm to calculate a current offset error Iof.

$$I_{of} = \frac{1}{Tm} \int_{Tm} \{Ib(t) - Im(t)\} dt \qquad (31)$$

$$\Delta SOCi \propto \sum \{Ib(t) - I_{of}\} \qquad (32)$$

$$SOCe = SOCe(0) + \Delta SOCi \qquad (33)$$

Operation unit 175 subtracts offset error Iof estimated by offset estimation unit 170 from the battery's current Ib(t) detected by current sensor 32 to obtain the battery's corrected current Ibc(t).

Current accumulation unit 180 obtains a cumulative value ΣIbc of the battery's corrected current Ibc(t) calculated by operation unit 175. SOC estimation unit 210 follows an expression (32) to obtain an amount of variation of SOC ΔSOCi in accordance with cumulative value ΣIbc of the battery's corrected current Ibc(t). The amount of variation of SOC ΔSOCi will indicate an amount of variation of SOC that is introduced after an operation is previously performed to estimate an SOC before the present time. Furthermore, SOC estimation unit 210 follows an expression (33) to calculate the current estimated SOC value SOCe in accordance with a sum of an estimated SOC value SOCe(0) obtained in a previous operation for estimation and the amount of variation of SOC ΔSOCi obtained through expression (32).

Figure 15:
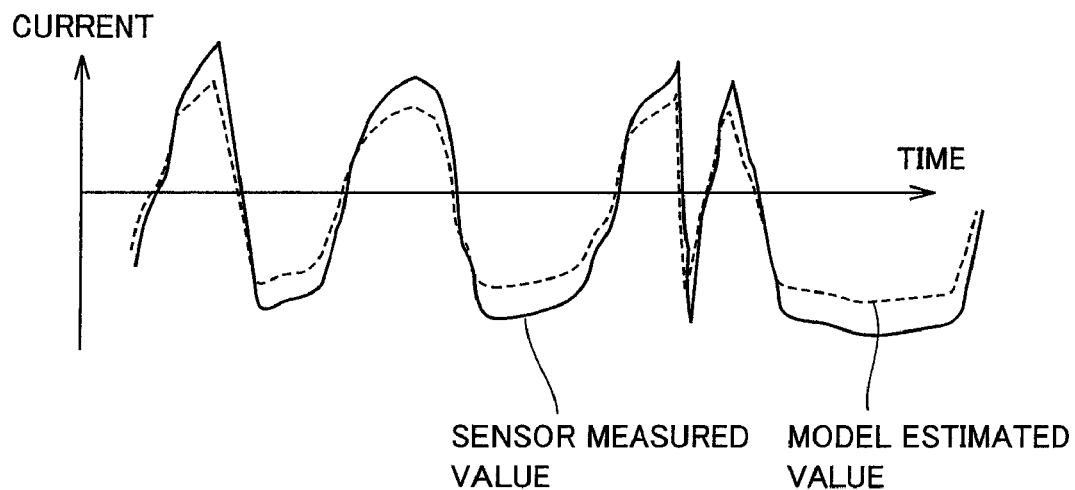
FIG. 15 is a conceptual waveform diagram representing a relationship between a value of a current of a battery as measured by a sensor and a model estimated value thereof.
Figure 16:
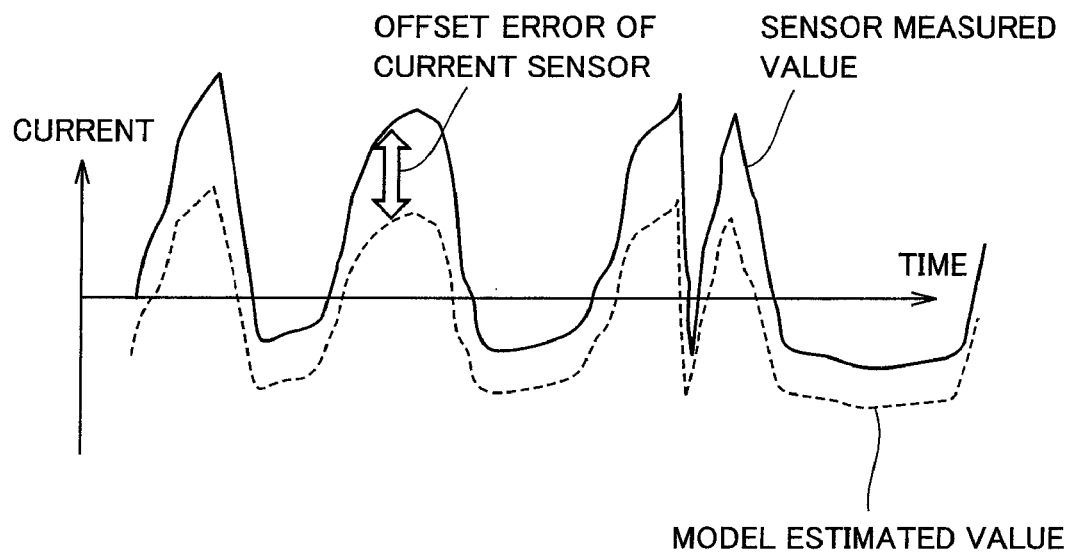
FIG. 16 is a conceptual waveform diagram representing an offset error of a current sensor.

Herein, as shown in FIG. 15, an error introduced in estimating a current by a battery model generally does not have something like an offset, and indicates a characteristic approaching zero as it is integrated for a long period of time. In contrast, as shown in FIG. 16, current sensor 32's offset error is held at a constant value, and a deviation of the battery's current Ib(t), which is a value measured by a sensor, and a model estimated value Im(t) will constantly have a constant direct current component. Thus an operation performed in offset estimation unit 170 based on expression (31) allows offset error Iof of current sensor 32 to be calculated.

Figure 17:
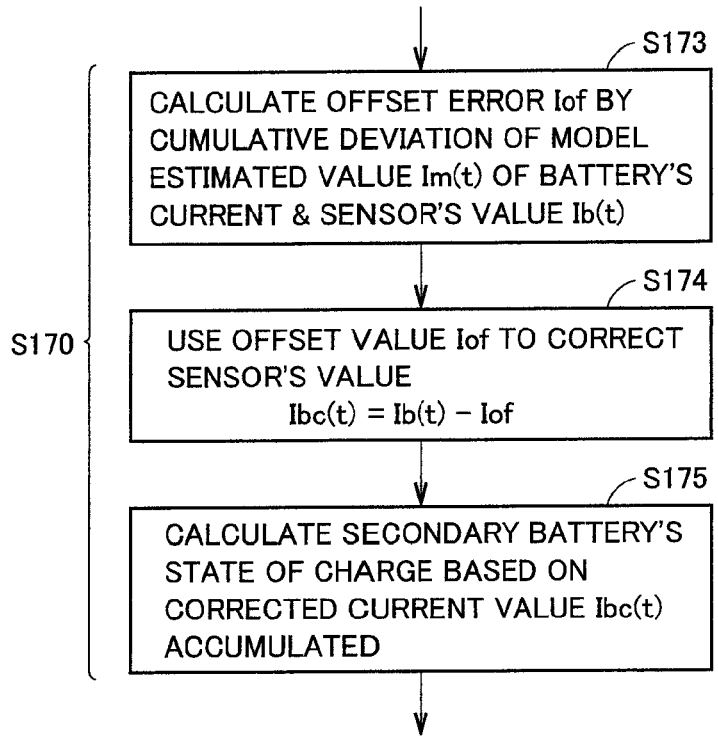
FIG. 17 is a flowchart for implementing estimating an SOC according to the second embodiment, as shown in FIG. 14, by a battery ECU.

FIG. 17 is a flowchart for implementing estimating an SOC according to the second embodiment, as shown in FIG. 14, by battery ECU 50. Such SOC estimation process as described above can be implemented by replacing the FIG. 12 step S170 with the FIG. 17 steps S173 to S175.

With reference to FIG. 17, battery ECU 50 in step S173 calculates offset error Iof by accumulating a deviation of model estimated value Im(t) of the battery's current based on the battery's current density I(t) obtained through a battery model with the battery's voltage V(t) serving as an input and value Ib(t) sensed by current sensor 32. In other words, step S173 corresponds to a function of offset estimation unit 170 shown in FIG. 14.

Furthermore, battery ECU 50 proceeds to step S174 to use offset error Iof to correct the sensor's value Ib(t) to calculate the battery's corrected current Ibc(t). Step S174 corresponds to a function of operation unit 175 shown in FIG. 14.

Then, battery ECU 50 in step S175 calculates the secondary battery's estimated state-of-charge value SOCe based on the battery's corrected current Ibc(t) accumulated. In other words, step S175 corresponds to a function of current accumulation unit 180 and SOC estimation unit 210 shown in FIG. 14.

Thus in the second embodiment the device estimating a state of a secondary battery can estimate SOC such that an offset error is detected as based on a battery model expression and a current having the offset error removed therefrom is accumulated and therefrom state of charge (SOC) of the secondary battery 10 can be estimated with high precision.

Second Embodiment in Exemplary Variation

Figure 18:
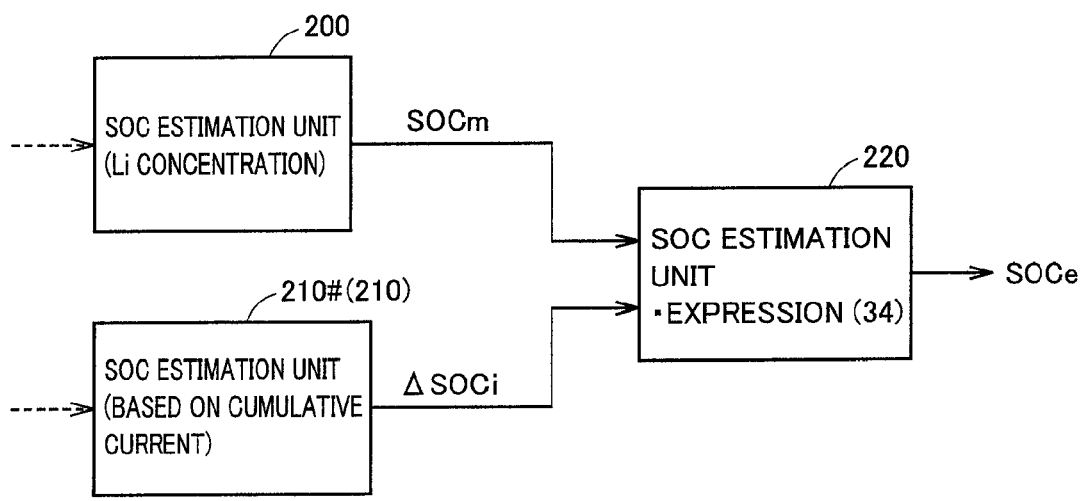
FIG. 18 is a block diagram for illustrating how a device estimating a state of a secondary battery estimates an SOC according to the second embodiment in an exemplary variation.

FIG. 18 is a block diagram for illustrating how a device estimating a state of a secondary battery estimates an SOC according to the second embodiment in an exemplary variation.

With reference to FIG. 18, the device estimating a state of a secondary battery according to the second embodiment includes SOC estimation unit 200 described in the first embodiment, an SOC estimation unit 210# based on an accumulation of current, and an SOC estimation unit 220 considering a result of estimating an SOC by unit 200 and that of estimating an SOC by unit 210# together to generate a final estimated SOC value SOCe.

SOC estimation unit 200, similarly as done in the first embodiment, estimates a model estimated SOC value SOCm, as based on an internal state of a secondary battery estimated in accordance with a battery model expression according to an embodiment of the present invention, in accordance with an average lithium concentration in an active material. The details are similar to those described with reference to FIG. 10. Accordingly, they will not be described repeatedly.

In contrast, SOC estimation unit 210# obtains an amount of variation of SOC ΔSOCi, as based on the battery's current Ib(t) measured by current sensor 32 and accumulated, for a period of an operation estimating an SOC.

Note that SOC estimation unit 210# is not limited to a configuration obtaining the amount of variation of SOC ΔSOCi based on an estimation of an offset error of current sensor 32, as based on a battery model, and an accumulation of the battery's corrected current Ibc(t) with the offset error corrected, as has been described with reference to FIG. 14, and may be configured to obtain the amount of variation of SOC ΔSOCi by accumulating the battery's current Ib(t) measured by current sensor 32. It should be noted, however, that configuring to use the FIG. 14 SOC estimation unit 210 as the FIG. 18 SOC estimation unit 210# allows the amount of variation of SOC ΔSOCi to be obtained with high precision through an effect of correcting the offset error.

SOC estimation unit 220 calculates final estimated SOC value SOCe based on an expression (34):

$$SOCe = SOCe(0) + k1 \cdot \Delta SOCi + k2 \cdot (SOCm - SOCe(0)) \qquad (34)$$

In expression (34), estimated SOC value SOCe is obtained by summing a previously estimated SOC value SOCe(0) plus a term of the amount of variation of SOC ΔSOCi, as based on a cumulative current, multiplied by a gain k1 plus a term of a difference of model estimated SOC value SOCm and previously estimated SOC value SOCe(0) multiplied by a gain k2.

For gains k1 and k2, k1>k2, and, for example, gain k1=1.0 and gain k2<1.0 allow a cumulative current and estimating an internal state by a battery model to be combined together to estimate an SOC. For estimating how an SOC varies for a short period of time, the amount of variation of SOC ΔSOCi, which is highly reliable, can be reflected with a small time constant, and to resolve an SOC estimation error caused as the secondary battery is used over a long period of time, model estimated value SOCm that reflects the secondary battery's variation in internal state can be reflected with a relatively large time constant.

Alternatively, gains k1 and k2 may be varied with the battery's state. For example, for low temperatures decreasing a battery model in precision, or when a large battery current is charged/discharged, it is preferable to decrease gain k2 and estimate an SOC mainly based on a cumulative current. In voltage-current relationship model expressions (M1c) and (M1d), in particular, with the arcsin h term linearly approximated, when the term $I(t)/\{2L_j a_{sj} i_{of}(\theta, T)\}$ exceeds a predetermined absolute value, the battery model expression has an increased error. More specifically, when a large current flows (|I(t)|>>0) and when the battery's temperature T is a low temperature decreasing exchange current density $i_{ej}(\theta, T)$, the above term has an increased absolute value and the battery model has an increased error. In such a case, for example, k2=0 can be set to stop estimating an SOC by the battery model and thus prevent the battery model from having an error increasing an error introduced in estimating a state of charge (SOC) of secondary battery 10.

Figure 19:
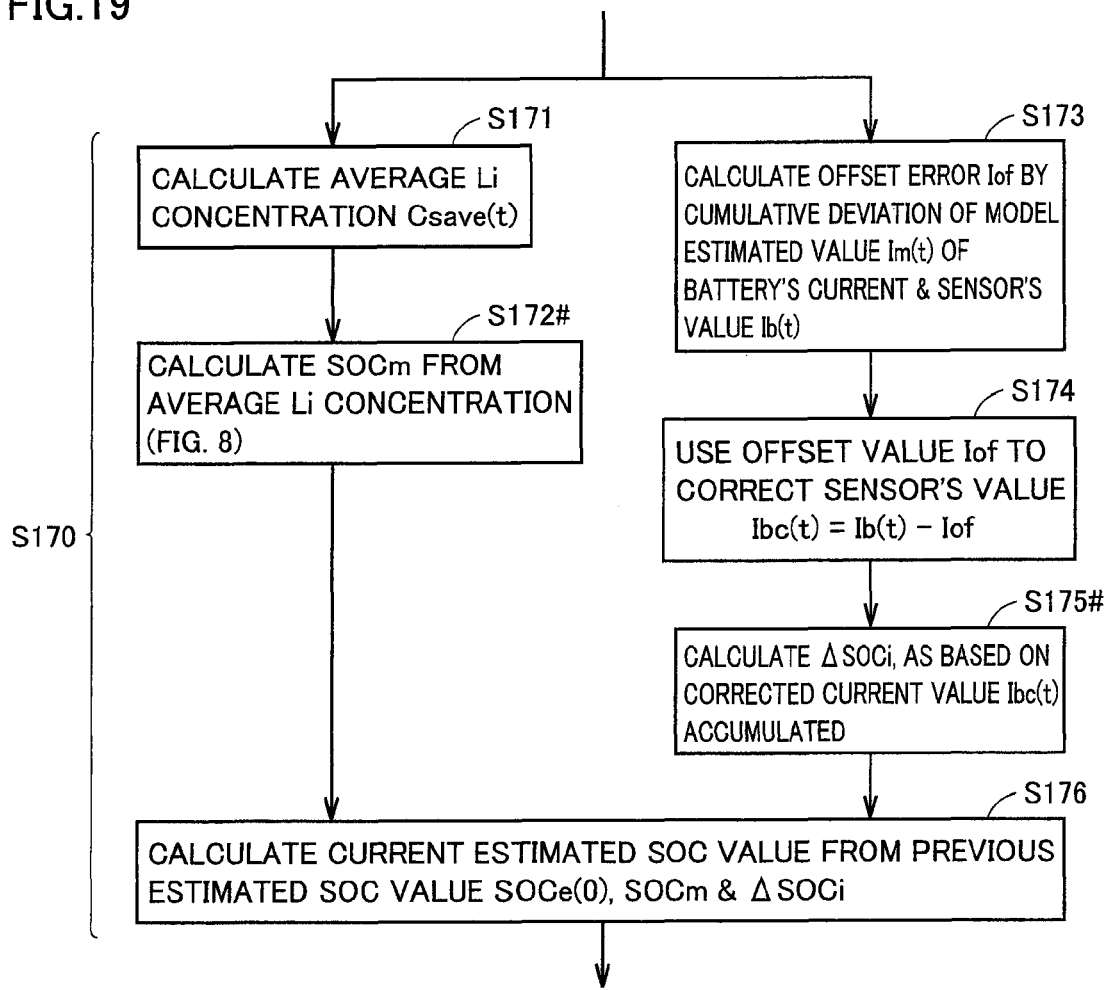
FIG. 19 is a flowchart for implementing estimating an SOC according to the exemplary variation of the second embodiment, as shown in FIG. 18, by a battery ECU.

FIG. 19 is a flowchart for implementing estimating an SOC according to the exemplary variation of the second embodiment, as shown in FIG. 18, by battery ECU 50.

With reference to FIG. 19, battery ECU 50 does not perform the FIG. 12 step S170 and instead performs the FIG. 19 steps S171, S172#, S173, S174, S175#, S176 to estimate an SOC according to the exemplary variation of the second embodiment as shown in FIG. 18.

With reference to FIG. 19, battery ECU 50 after step S171 (similar to that shown in FIG. 12) proceeds to step S172# to perform a step similar to step S172, i.e., calculate model estimated SOC value SOCm from average lithium concentration $c_{save}$ obtained at step S171.

Furthermore, battery ECU 50 after steps S173, S174 (similar to those shown in FIG. 17) proceeds to step S175# to calculate an amount of variation of SOC ΔSOCi, as based on corrected current value Ibc(t) accumulated, during a period of performing an operation to estimate an SOC. Note that step S175# of calculating the amount of variation of SOC ΔSOCi, as described above, may be done by accumulating value Ib(t) measured by current sensor 32 without correcting offset error Iof.

Furthermore, battery ECU 50 in step S176 calculates the current estimated SOC value SOCe in accordance with expression (34) based on previously estimated SOC value SOCe(0), model estimated SOC value SOCm obtained in step S172, and the amount of variation of SOC ΔSOCi obtained in step S175#.

Thus, estimating an SOC from an accumulation of current, which is highly reliable, for estimating how the secondary battery varies in SOC for a short period of time, and estimating an SOC by a battery model expression reflecting how the secondary battery's internal state varies can be combined, as appropriate, to estimate the secondary battery's state of charge (SOC) with high precision.

Third Embodiment

The battery model expressions described in the first and second embodiments are derived on the assumption that a battery's entire current flows through an active material and contributes to an electrochemical reaction. In reality, however, for example for low temperatures in particular, an effect of an electric double layer capacitor that is caused at an interface of the electrolytic solution and the active material manifests and the battery's entire current is split into an electrochemical reaction current contributing to an electrochemical reaction and a current flowing through the capacitor.

Figure 20:
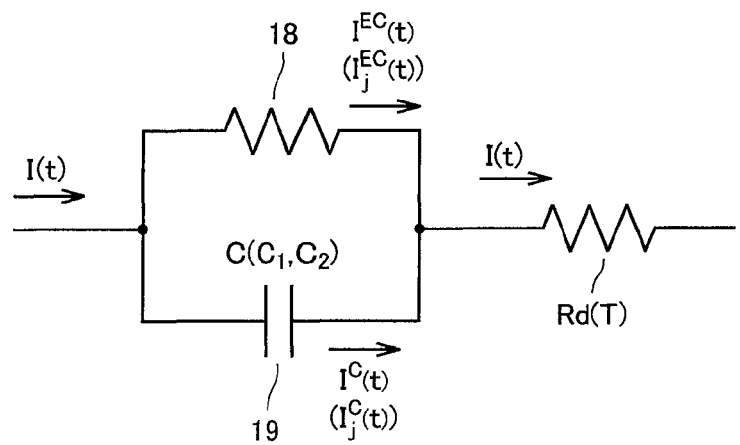
FIG. 20 is a circuit diagram schematically showing a secondary battery's equivalent circuit model with an electric double layer capacitor considered.

FIG. 20 is a circuit diagram schematically showing a secondary battery's equivalent circuit model with such an electric double layer capacitor considered.

With reference to FIG. 20, the battery's current density I(t) corresponds to the battery's entire current component, which is split into an electrochemical reaction current component (a current density $I^{EC}(t)$) flowing through active material model 18, which collectively represents the positive electrode's active material model 18p and the negative electrode's active material model 18n, and a capacitor's current component (a current density $I^C(t)$) flowing through an electric double layer capacitor 19. In other words, the battery's current density I(t) is indicated by a sum of electrochemical reaction current density $I^{EC}(t)$ and the capacitor's current density $I^C(t)$.

The electrochemical reaction current component flowing through active material model 18 contributes to an electrochemical reaction, whereas the capacitor's current component does not contribute to the electrochemical reaction, and pure direct current resistance Rd(t) indicated in expressions (M1a) to (M1d) has the battery's entire current component passing therethrough.

In the third embodiment, a battery model expression is configured to separate the capacitor's current component that passes through the electric double layer capacitor from the electrochemical reaction current component.

Figure 21:
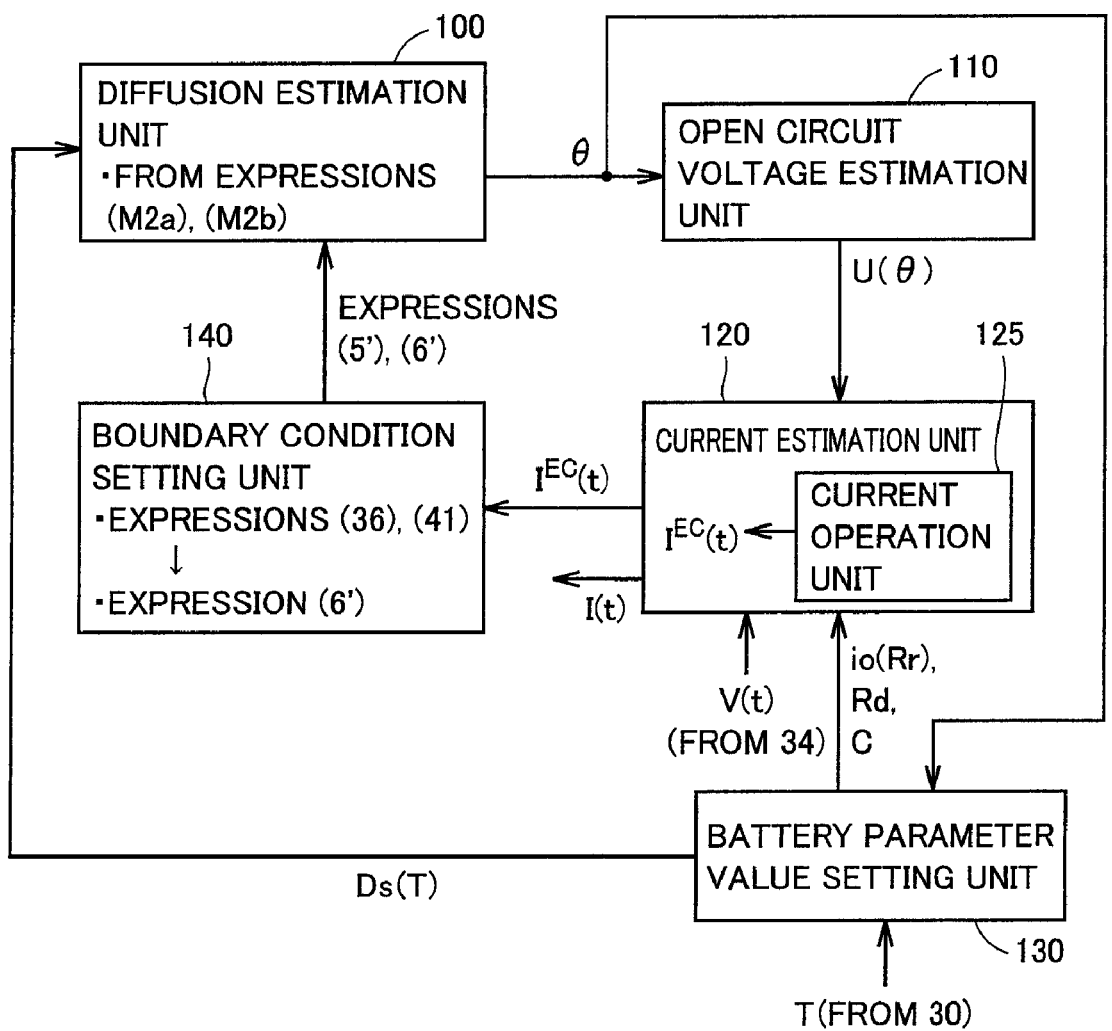
FIG. 21 is a block diagram for schematically illustrating a configuration of a device estimating a state of a secondary battery according to a third embodiment.

FIG. 21 is a block diagram for schematically illustrating a configuration of a device estimating a state of a secondary battery according to the third embodiment.

As can be understood from comparing FIG. 21 with FIG. 9, the third embodiment provides a device estimating a state of a secondary battery with current estimation unit 120 configured to further include a current operation unit 125.

Initially, when separating the capacitor's current component is considered in accordance with the FIG. 20 battery model, voltage-current relationship model expression (M1a) is varied, as will be described hereinafter.

As can be understood from FIG. 20, for negative electrode 12 and positive electrode 15, a relationship is established between a total current density I(t), electrochemical reaction current density $I^{EC}(t)$, and the capacitor's current density $I^C(t)$, as indicated below by an expression (35). Active material model 18 has an electrochemical reaction involving only electrochemical reaction current density $I_j^{EC}(t)$. Accordingly, an electrochemical reaction expression simplified, assuming that in the electrode the electrochemical reaction is caused uniformly, i.e., expression (21), is modified to be an expression (36).

Furthermore, in expression (35), the capacitor's current density $I_j^C(t)$ is represented by an expression (37) indicated below.

$$I(t) = I_1^{EC}(t) + I_1^C(t) = I_2^{EC}(t) + I_2^C(t) \quad (35)$$

$$I_1^{EC}(t) = -j_1^{Li}\#(\theta_1, t)L_1, \ I_2^{EC}(t) = j_2^{Li}(\theta_2, t)L_2 \quad (36)$$

$$I_1^C(t) = -C_1 \frac{d\psi_1(t)}{dt}, \ I_2^C(t) = C_2 \frac{d\psi_2(t)}{dt} \quad (37)$$

Note that expression (37) includes voltages $\psi_1(t)$ and $\psi_2(t)$, which are provided by a sum of open circuit voltage U(θ, t) and overvoltage η(t) of positive electrode 15, and a sum of open circuit voltage U(θ, t) and overvoltage η(t) of negative electrode 12, as indicated below by expressions (38) and (39), respectively.

$$\psi_1(t) = U_1\#(\theta_1, t) + \eta_1\#(t) \quad (38)$$
$$= U_1\#(\theta, t) + \frac{RT}{\alpha_{aj}F}\text{arcsin}h\left[\frac{-I_1^{EC}(t)}{2L_1 a_{s1} i_{01}(\theta_1, T, t)}\right]$$

$$\psi_2(t) = U_2\#(\theta_2, t) + \eta_2\#(t) \quad (39)$$
$$= U_2\#(\theta_2, t) + \frac{RT}{\alpha_{aj}F}\text{arcsin}h\left[\frac{I_2^{EC}(t)}{2L_2 a_{s2} i_{02}(\theta_2, T, t)}\right]$$

$I_1^{EC}(t)$ and $I_2^{EC}(t)$ can thus be calculated by sequentially calculating voltages $\psi_1(t)$ and $\psi_2(t)$ in accordance with expressions (38) and (39), and solving expressions (37) and (35) having substituted therein a voltage value obtained in the previous operating period and that obtained in the current operating period. More specifically, current operation unit 125 of FIG. 21 is configured by providing expressions (35) to (39) as simultaneous equations.

Furthermore, voltage-current relationship model expression (M1a) is converted to an expression (M4a), which corresponds to expression (M1a) such that a current density on the right-hand side at the second term indicating a polarization potential is replaced with electrochemical reaction current densities $I_1^{EC}(t)$ and $I_2^{EC}(t)$.

$$V(t) = U_1\#(\theta_1, t) - U_2\#(\theta_2, t) + \qquad (M4a)$$

$$\frac{RT}{\alpha_{a1}F} \left\{ \begin{array}{l} \mathrm{arcsinh}\left(\dfrac{-I_1^{EC}(t)}{2L_1 a_{s1} i_{01}(\theta_1, T, t)}\right) - \\ \mathrm{arcsinh}\left(\dfrac{I_2^{EC}(t)}{2L_2 a_{s2} i_{02}(\theta_2, T, t)}\right) \end{array} \right\} -$$

$$\underbrace{I(t)\left(\frac{L_1}{3\kappa_1^{\mathit{eff}}} + \frac{L_s}{3\kappa_s^{\mathit{eff}}} + \frac{L_2}{3\kappa_2^{\mathit{eff}}} + \frac{L_1}{3\sigma_1^{\mathit{eff}}} + \frac{L_2}{3\sigma_2^{\mathit{eff}}}\right)}_{Rd(T)}$$

Current estimation unit 120 thus calculates the battery's current density $I(t)$ based on model expression (M4a). More specifically, expression (M3a) having the battery's current density $I(t)$ of a term that is relevant to overvoltage replaced with electrochemical reaction current densities $I_1^{EC}(t)$ and $I_2^{EC}(t)$ can be solved similarly as done for expression (M3a) to also obtain current density $I(t)$.

Furthermore, as shown in expression (36), boundary condition setting unit 140 uses electrochemical reaction current density $I_j^{EC}(t)$ to set a boundary condition of the active material diffusion model expressions (M2a), (M2b) of negative electrode 12 and positive electrode 15.

Similarly, a variation will be described that is provided when separating a capacitor's current component is considered for voltage-current relationship model expression (M1b).

When a positive electrode and a negative electrode share an active material model, as indicated in expression (M1b), total current density $I(t)$, electrochemical reaction current density $I^{EC}(t)$, and capacitor $I^C(t)$ indicated in the FIG. 20 battery model have a relationship indicated below by an expression (40). Furthermore, expression (21') indicating a relationship between reaction current density $j_j^{Li}$ and a current density is converted to an expression (41) indicated below. Furthermore, expressions (37) to (39) relevant to the capacitor's current are replaced with expressions (42) and (43) indicated below.

$$I(t) = I^{EC}(t) + I^C(t) \qquad (40)$$

$$j^{Li}\#(\theta, t) = -\frac{I^{EC}(t)}{L} \qquad (41)$$

$$I^C(t) = -C\frac{d\psi(t)}{dt} \qquad (42)$$

-continued $$\begin{aligned} \psi(t) &= U(\theta, t) + \eta\#(t) \\ &= U(\theta, t) + \frac{RT}{\alpha_a F}\mathrm{arcsinh}\left[\frac{-I^{EC}(t)}{2La_s i_0(\theta, T, t)}\right] \end{aligned} \qquad (43)$$

Accordingly when separating the capacitor's current component is considered for voltage-current relationship model expression (M1b), expressions (40) to (43) configure current operation unit 125 and an operation is performed to obtain reaction current density $I^{EC}(t)$.

Furthermore, model expression (M1b) in current estimation unit 120 has the second term (or the overvoltage term) with current density $I(t)$ substituted with electrochemical reaction current density $I^{EC}(t)$. In other words, it is converted to a model expression (M4b) indicated below. More specifically, current estimation unit 120 can also obtain current density $I(t)$ by solving, in a manner similarly done for expression (M3a), expression (M3b) having a term relevant to overvoltage with the battery's current density $I(t)$ replaced with electrochemical reaction current density $I^{EC}(t)$.

$$V(t) = U(\theta, t) + \frac{RT}{\alpha_{a1}F}\mathrm{arcsinh}\left(\frac{-I^{EC}(t)}{2L_1 a_s i_0(\theta, T, t)}\right) - \qquad (M4b)$$

$$\underbrace{I(t)\left(\frac{L_1}{3\kappa_1^{\mathit{eff}}} + \frac{L_s}{3\kappa_s^{\mathit{eff}}} + \frac{L_2}{3\kappa_2^{\mathit{eff}}} + \frac{L_1}{3\sigma_1^{\mathit{eff}}} + \frac{L_2}{3\sigma_2^{\mathit{eff}}}\right)}_{Rd(T)}$$

Then will be described a variation that considers separating a capacitor's current component for a voltage-current relationship model expression having an arcsin h term linearly approximated, or voltage-current relationship model expression (M1c).

Initially, for model expression (M1c) considering separate active material models for positive and negative electrodes, expressions (35), (37) are applied for a relationship between total current density $I(t)$, electrochemical reaction current densities $I_1^{EC}(t)$, $I_2^{EC}(t)$, and the capacitor's current density $I^C(t)$, and expression (36) can be applied similarly for reaction current density. It should be noted, however, that for voltage $\psi(t)$, expressions (38), (39) are not applied and an expression (44) instead is applied, as indicated below:

$$\left. \begin{array}{l} \psi_1(t) = U_1\#(\theta_1, t) - Rr(\theta_1, T, t) \cdot I_1^{EC}(t) \\ \psi_2(t) = U_2\#(\theta_2, t) - Rr(\theta_2, T, t) \cdot I_2^{EC}(t) \end{array} \right\} \qquad (44)$$

In this case, expression (44) can also be provided together with expressions (35), (37) as simultaneous equations to obtain electrochemical reaction current densities $I_1^{EC}(t)$, $I_2^{EC}(t)$. More specifically, current operation unit 125 of FIG. 21 is configured by providing expressions (35), (37), (44) as simultaneous equations. Furthermore, model expression (M1c) is converted to an expression (M4c) indicated below:

$$V(t) = U_1\#(\theta, t) + U_2\#(\theta, t) + \qquad (M4c)$$

$$\frac{RT}{2\alpha_{a1}F}\left\{\frac{-I_1^{EC}(t)}{L_1 a_{s1} i_{01}(\theta_1, T, t)} - \frac{I_2^{EC}(t)}{L_2 a_{s2} i_{02}(\theta_2, T, t)}\right\} - I(t) \cdot Rd(T)$$

Consequently in current estimation unit 120 an expression (M3c') indicated below can be applied in place of expression (M3c) to obtain current density I(t).

$$h[I(t)] = V(t) - U_1 \#(\theta, t) + U_2 \#(\theta, t) - \frac{RT}{2\alpha_{a1}F}\left\{\frac{-I_1^{EC}(t)}{L_1 a_{s1} i_{01}(\theta_1, T, t)} - \frac{I_2^{EC}(t)}{L_2 a_{s2} i_{02}(\theta_2, T, t)}\right\} - I(t) \cdot Rd(T) \quad (M3c')$$

Finally will be described a variation considering a capacitor's current of voltage-current relationship model expression (M1d).

In this case, which has a positive electrode and a negative electrode sharing a common active material model and also considers the capacitor's current, an expression (45) indicated below is established for current density I(t), electrochemical reaction current density $I^{EC}(t)$ and the capacitor's current density $I^C(t)$. Expression (45) includes $\psi(t)$, which is indicated by an expression (46), as indicated below, as a sum of open circuit voltage and polarization potential, as has been described previously. Furthermore, reaction current density $j_j^{Li}$ corresponding to an amount of lithium generated is obtained by an expression (47) using electrochemical reaction current density $I^{EC}(t)$, as indicated below.

$$I(t) = I^{EC}(t) + I^C(t) \quad (45)$$
$$= I^{EC}(t) - C\frac{d\psi(t)}{dt}$$

$$\psi(t) = U(\theta, t) - Rr(\theta, T, t) \cdot I^{EC}(t) \quad (46)$$

$$j^{Li}\#(\theta, t) = -\frac{I^{EC}(t)}{L} \quad (47)$$

In this case also, voltage $\psi(t)$ defined by expression (46) that is provided together with expression (45) as simultaneous equations can be solved to obtain electrochemical reaction current density $I^{EC}(t)$. In other words, current operation unit 125 of FIG. 21 is configured by providing expressions (45), (46) as simultaneous equations.

Furthermore, voltage-current model expression (M1d) in current estimation unit 120 has a right-hand side having a second term (a term relevant to polarization potential) with current density I(t) replaced with electrochemical reaction current density $I^{EC}(t)$ and is thus converted to a model expression (M4d). Consequently in current estimation unit 120 an expression (M3d') can be applied in place of expression (M3d) to obtain current density I(t).

$$V(t) = U(\theta, t) - Rr(\theta, T, t) \cdot I^{EC}(t) - Rd(T) \cdot I(t) \quad (M4d)$$

$$I(t) = -\frac{V(t) - U(\theta, t) + Rr(\theta, T) \cdot I^{EC}(t)}{Rd(T)} \quad (M3d')$$

As has been described above, the third embodiment provides a device estimating a state of a secondary battery, that can separate current density I(t) into electrochemical reaction current density $I^{EC}(t)$ and a capacitor's current density $I^C(t)$ that does not contribute to an electrochemical reaction to estimate the battery's internal behavior. The device can thus estimate the secondary battery's internal state, more specifically, how lithium is distributed in concentration in an active material, more precisely to estimate the internal state more precisely. Furthermore, combining such a device estimating a secondary battery's internal state, as described above, with estimating an SOC, as has been described in the latter half of the first embodiment or the second embodiment, allows the secondary battery's state of charge (SOC) to be estimated with high precision.

Furthermore, electric double layer capacitor 19 shown in FIG. 20 is temperature-dependent. Accordingly, a map that is also previously prepared, as based on a result of an experiment or the like, for a capacitance C ($C_1$, $C_2$) in a model expression used in current operation unit 125 allows battery parameter value setting unit 130 to set the capacitance variably in accordance with the battery's temperature T.

The first to third embodiments as described above have been described with a secondary battery implemented as a lithium ion battery. However, the present device estimating a state of a secondary battery is applicable not only to the lithium ion battery but also other types of secondary batteries without particularly limiting the type of load. For a nickel hydrogen battery, for example, calculating by a diffusion equation how protons are distributed in density in an active material as a reaction-involved material and defining an open circuit voltage as a function of the protons of a surface of the active material allow the method of the present invention to be similarly applied.

Furthermore, it is also described for confirmation that estimating how a reactant material is distributed in concentration by the device estimating an internal state of a secondary battery, as described in the present invention with reference to FIG. 1 to FIG. 9, can also be combined with a method of estimating an SOC that is other than described in the present specification to implement a device estimating a state of charge (SOC) of a secondary battery.

It should be understood that the embodiments disclosed herein are illustrative and non-restrictive in any respect. The scope of the present invention is defined by the terms of the claims, rather than the description above, and is intended to include any modifications within the scope and meaning equivalent to the terms of the claims.

INDUSTRIAL APPLICABILITY

The present device estimating a state of a secondary battery is applicable to a secondary battery used in a power supply system configured to allow a chargeable secondary battery to supply a load with power and to also allow the secondary battery to be charged, as required, while the load is in operation.

The invention claimed is:

1. A device estimating a state of a secondary battery including first and second electrodes configured to include an active material containing a reactant material contributing to an electrochemical reaction and an ion conductor for conducting between said first and second electrodes said reactant material ionized, the device comprising:

a voltage detector that detects a voltage of said battery between said first and second electrodes;

a diffusion estimation unit that estimates a distribution in concentration of said reactant material in accordance with an active material diffusion model expression defining said distribution in concentration of said reactant material in said active material, as based on a given boundary condition;

an open circuit voltage estimation unit that estimates an open circuit voltage between said first and second electrodes, as based on a concentration of said reactant material obtained at an interface of said active material with an electrolytic solution, as estimated by said diffusion estimation unit;

a current estimation unit that estimates a density of a current of said secondary battery in accordance with a voltage-current relationship model expression based on the electrochemical reaction and indicating a relationship between said open circuit voltage, an overvoltage calculated in accordance with said density of said current of said secondary battery, a voltage drop caused in accordance with said density of said current of said secondary battery, and said voltage of said battery, said current estimation unit calculating said density of said current of said secondary battery by substituting in said voltage-current relationship model expression said voltage of said battery detected by said voltage detector, said open circuit voltage estimated by said open circuit voltage estimation unit, and a parameter value of said secondary battery; and a boundary condition setting unit that calculates a reaction current density at said interface, as based on said density of said current of said battery estimated by said current estimation unit, and sets said boundary condition for said active material diffusion model expression for said interface in accordance with said reaction current density calculated.

2. The device estimating a state of a secondary battery according to claim 1, further comprising:

a temperature detector that detects a temperature of said secondary battery; and a parameter value setting unit for setting said parameter value variably in accordance with at least said temperature of said battery, said parameter value setting unit further setting a parameter value indicative of a diffusion rate in said active material diffusion model expression variably in accordance with at least said temperature of said battery.

3. The device estimating a state of a secondary battery according to claim 2, wherein:

said voltage-current relationship model expression is configured by a linearly approximated expression indicating that said open circuit voltage minus a product of said density of said current of said battery and an electrical resistance provided per a unit area of said electrode that is served as said parameter value is a voltage equal to said voltage of said battery; and said parameter value setting unit sets said electrical resistance variably in accordance with said concentration of said reactant material obtained at said interface, as estimated by said diffusion estimation unit, and said temperature of said battery detected by said temperature detector.

4. The device estimating a state of a secondary battery according to claim 1, further comprising a current operation unit that separates said density of said current of said secondary battery in total into a first current density contributing to said electrochemical reaction and a second current density caused by a component caused in said secondary battery for an electric double layer capacitor, wherein:

said boundary condition setting unit calculates said reaction current density at said interface, as based on said first current density calculated by said current operation unit; and in said voltage-current relationship model expression, said overvoltage is calculated based on said first current density.

5. The device estimating a state of a secondary battery according to claim 4, further comprising:

a temperature detector that detects a temperature of said secondary battery; and a parameter value setting unit for setting said parameter value variably in accordance with at least said temperature of said battery, wherein:

said voltage-current relationship model expression is configured of: a linearly approximated expression indicating that a product of said first current density and a first electrical resistance provided per a unit area of said electrode that is served as said parameter value is equal to said voltage of said battery; and an expression indicating that said second current density flowing through said capacitor per said unit area of said electrode that is served as said parameter value is a value proportional to an amount of said voltage of said battery that varies with time; and said parameter value setting unit sets said first electrical resistance variably in accordance with said concentration of said reactant material obtained at said interface, as estimated by said diffusion estimation unit, and said temperature of said battery detected by said temperature detector, and also variably sets a capacitance per said unit area of said electrode in accordance with said temperature of said battery.

6. The device estimating a state of a secondary battery according to claim 1, wherein said diffusion estimation unit has said active material diffusion model expression represented by a polar coordinate for each of said first and second electrodes.

7. The device estimating a state of a secondary battery according to claim 1, wherein said diffusion estimation unit has said active material diffusion model expression represented by a polar coordinate and shared by said first and second electrodes.

8. The device estimating a state of a secondary battery according to claim 1, wherein said voltage-current relationship model expression is derived as based on: a voltage equation indicating a relationship between average potentials of said active material and said electrolytic solution, an average value of an overvoltage generated as said electrochemical reaction is caused at said interface, and said open circuit voltage; and an electrochemical reaction expression indicating a relationship between said density of said current of said battery and said average value of said overvoltage.

9. The device estimating a state of a secondary battery according to claim 8, wherein, assuming that said first and second electrodes each have said electrochemical reaction caused therein uniformly without site dependence, said voltage-current relationship model expression is derived by simplifying a distribution in potential of said active material in said electrode and said electrolytic solution to a quadric, and in that condition, obtaining said average potentials of said active material and said electrolytic solution.

10. The device estimating a state of a secondary battery according to claim 1, further comprising:

an average concentration calculation unit that calculates an average concentration of said reactant material in said active material, as based on said distribution in concentration of said reactant material estimated by said diffusion estimation unit; and a first state-of-charge estimation unit that estimates a state of charge of said secondary battery in accordance with a previously obtained correspondence relationship between said average concentration and said state of charge, as based on said average concentration calculated by said average concentration calculation unit.

11. The device estimating a state of a secondary battery according to claim 10, further comprising:
- a current detector that detects a current of said secondary battery;
- a second state-of-charge estimation unit that estimates an amount of variation of said state of charge of said secondary battery, as based on said current of said battery accumulated; and
- a third state-of-charge estimation unit that sequentially updates an estimated value of said state of charge of said secondary battery, as based on a result of estimating by said first and second state-of-charge estimation units, wherein:
- said third state-of-charge estimation unit calculates a current value of said estimated value of said state of charge by reflecting said amount of variation of said state of charge from said previous value estimated by said second state-of-charge estimation unit, and an error in state of charge between a current state of charge estimated by said first state-of-charge estimation unit and a previous value of said estimated value of said state of charge, on said previous value; and
- said amount of variation of said state of charge is reflected with a time constant relatively smaller than that applied in reflecting said error in state of charge.

12. The device estimating a state of a secondary battery according to claim 10, further comprising:
- a current detector that detects a current of said secondary battery;
- a second state-of-charge estimation unit that estimates an amount of variation of said state of charge of said secondary battery, as based on said current of said battery accumulated; and
- a third state-of-charge estimation unit that sequentially updates an estimated value of said state of charge of said secondary battery, as based on a result of estimating by said first and second state-of-charge estimation units, wherein:
- said third state-of-charge estimation unit calculates a current value of said estimated value of said state of charge by reflecting said amount of variation of said state of charge from said previous value estimated by said second state-of-charge estimation unit, and an error in state of charge between a current state of charge estimated by said first state-of-charge estimation unit and a previous value of said estimated value of said state of charge, on said previous value, on said previous value; and
- when said current of said battery has an absolute value larger than a predetermined value or said temperature of said secondary battery is lower than a predetermined temperature, said third state-of-charge estimation unit calculates said current value of said estimated value of said state of charge with ceasing to reflect said error in state of charge.

13. The device estimating a state of a secondary battery according to claim 11, further comprising an offset estimation unit that calculates an estimated value of said current of said battery, as based on said density of said current of said battery estimated by said current estimation unit, and estimates an offset error of said current detector, as based on an error of said estimated value of said current of said battery and a value detected by said current detector, wherein said second state-of-charge estimation unit uses said offset error estimated by said offset estimation unit to correct said value of said current of said battery detected by said current detector, and estimates said amount of variation of said state of charge of said secondary battery, as based on an accumulation of said value detected that is corrected.

14. The device estimating a state of a secondary battery according to claim 1, further comprising:
- a current detector that detects a current of said secondary battery;
- an offset estimation unit that calculates an estimated value of said current of said battery, as based on said density of said current of said battery estimated by said current estimation unit, and estimates an offset error of said current detector, as based on an error of said estimated value of said current of said battery and a value detected by said current detector; and
- a state-of-charge estimation unit that uses said offset error estimated by said offset estimation unit to correct said value of said current of said battery detected by said current detector, and estimates an amount of variation of said state of charge of said secondary battery, as based on an accumulation of said value detected that is corrected.

* * * * *

UNITED STATES PATENT AND TRADEMARK OFFICE
CERTIFICATE OF CORRECTION

PATENT NO. : 8,093,902 B2
APPLICATION NO. : 12/447715
DATED : January 10, 2012
INVENTOR(S) : Nishi et al.

It is certified that error appears in the above-identified patent and that said Letters Patent is hereby corrected as shown below:

In the Specifications:

| Column | Line | |
|---|---|---|
| 11 | 38-39 | Replace expression (9) with the following: |

$$\nabla \cdot \left[\kappa_j^{\mathit{eff}}(x,t)\nabla \phi_{ej}(x,t)\right] + \nabla \cdot \left[\kappa_{Dj}^{\mathit{eff}}(x,t)\nabla \ln c_{ej}(x,t)\right] + j_j^{Li}(x,\theta_j,t) = 0 \quad \ldots (9)$$

| 15 | 19-27 | Replace expression (M1a) with the following: |

$$V(t) = U_1 \#(\theta_1,t) - U_2\#(\theta_2,t)$$
$$+ \frac{RT}{\alpha_{a1}F}\left\{\operatorname{arcsin} h\left(\frac{-I(t)}{2L_1 a_{s1} i_{01}(\theta_1,T,t)}\right) - \operatorname{arcsin} h\left(\frac{I(t)}{2L_2 a_{s2} i_{02}(\theta_2,T,t)}\right)\right\}$$
$$- I(t)\underbrace{\left(\frac{L_1}{3\kappa_1^{\mathit{eff}}} + \frac{L_s}{3\kappa_s^{\mathit{eff}}} + \frac{L_2}{3\kappa_2^{\mathit{eff}}} + \frac{L_1}{3\sigma_1^{\mathit{eff}}} + \frac{L_2}{3\sigma_2^{\mathit{eff}}}\right)}_{Rd(T)} \quad \ldots \text{(M1a)}$$

| 17 | 8-10 | Replace expression (M2b) with the following: |

$$\frac{\partial c_s(r,t)}{\partial t} = D_s\left[\frac{\partial^2 c_s}{\partial r^2} + \frac{2}{r}\frac{\partial c_s}{\partial r}\right] \quad \ldots \text{(M2b)}$$

| 17 | 29-35 | Replace expression (M1c) with the following: |

$$V(t) = U_1\#(\theta_1,t) - U_2\#(\theta_2,t)$$
$$+\frac{RT}{\alpha_{a1}F}\frac{-I(t)}{2L_1 a_{s1} i_{01}(\theta_1,T,t)} - \frac{RT}{\alpha_{a1}F}\frac{I(t)}{2L_2 a_{s2} i_{02}(\theta_2,T,t)}$$
$$- I(t)\underbrace{\left(\frac{L_1}{3\kappa_1^{\mathit{eff}}} + \frac{L_s}{3\kappa_s^{\mathit{eff}}} + \frac{L_2}{3\kappa_2^{\mathit{eff}}} + \frac{L_1}{3\sigma_1^{\mathit{eff}}} + \frac{L_2}{3\sigma_2^{\mathit{eff}}}\right)}_{Rd(T)} \quad \ldots \text{(M1c)}$$

Signed and Sealed this
Thirtieth Day of April, 2013

Teresa Stanek Rea
*Acting Director of the United States Patent and Trademark Office*